US012684913B2

(12) United States Patent
Miyairi et al.

(10) Patent No.: US 12,684,913 B2
(45) Date of Patent: Jul. 14, 2026

(54) LIGHT-EMITTING DEVICE AND METHOD FOR MANUFACTURING SAME

(71) Applicant: NICHIA CORPORATION, Anan (JP)

(72) Inventors: Hiroshi Miyairi, Yokohama (JP);
Takayuki Igarashi, Yokohama (JP);
Shinya Endo, Yokohama (JP);
Yoshifumi Hodono, Yokohama (JP);
Yoshimi Katsumoto, Yokohama (JP)

(73) Assignee: NICHIA CORPORATION, Anan (JP)

( * ) Notice: Subject to any disclaimer, the term of this patent is extended or adjusted under 35 U.S.C. 154(b) by 845 days.

(21) Appl. No.: 17/800,940

(22) PCT Filed: Feb. 5, 2021

(86) PCT No.: PCT/JP2021/004319
§ 371 (c)(1),
(2) Date: Aug. 19, 2022

(87) PCT Pub. No.: WO2021/166684
PCT Pub. Date: Aug. 26, 2021

(65) Prior Publication Data
US 2023/0072941 A1 Mar. 9, 2023

(30) Foreign Application Priority Data

Feb. 20, 2020 (JP) ................................. 2020-027245
Apr. 13, 2020 (JP) ................................. 2020-071669

(51) Int. Cl.
*H10H 20/851* (2025.01)
*H10H 20/01* (2025.01)
(Continued)

(52) U.S. Cl.
CPC .......... *H10H 20/851* (2025.01); *H10H 20/01* (2025.01); *H10H 20/814* (2025.01); *H10H 20/854* (2025.01); *H10H 20/0361* (2025.01)

(58) Field of Classification Search
None
See application file for complete search history.

(56) References Cited

U.S. PATENT DOCUMENTS

2008/0231170 A1* 9/2008 Masato ................ C09K 11/584
430/23
2009/0086449 A1 4/2009 Minamio et al.
(Continued)

FOREIGN PATENT DOCUMENTS

JP 2009-081346 A 4/2009
JP 2010-283281 A 12/2010
(Continued)

OTHER PUBLICATIONS

International Search Report in PCT/JP2021/004319, dated Apr. 20, 2021.

*Primary Examiner* — Khaja Ahmad
(74) *Attorney, Agent, or Firm* — Spencer Fane LLP

(57) ABSTRACT

A light-emitting device includes a substrate, a light-emitting element provided on the substrate, the light-emitting element being configured to emit a first light, a wavelength conversion layer provided on the light-emitting element and containing a plurality of wavelength conversion particles configured to convert a wavelength of a part of the first light and to emit a second light, a light-transmissive plate provided above the wavelength conversion layer, and a wall including a light-reflective material, the wall surrounding the wavelength conversion layer and the light-transmissive plate and being in contact with a lateral surface of the light-transmissive plate at an inner surface of the wall. An upper portion of the wavelength conversion layer includes protrusions and recesses defined by the plurality of wavelength conversion particles. The wavelength conversion layer and the light-transmissive plate define an air layer therebetween.

15 Claims, 16 Drawing Sheets

(51) Int. Cl.

| | | |
|---|---|---|
| *H10H 20/814* | (2025.01) | |
| *H10H 20/854* | (2025.01) | |

(56) References Cited

U.S. PATENT DOCUMENTS

| | | | |
|---|---|---|---|
| 2015/0263239 A1 | 9/2015 | Watanabe | |
| 2016/0093780 A1 | 3/2016 | Beppu et al. | |
| 2016/0303394 A1* | 10/2016 | Hayashi | A61L 2/10 |
| 2017/0067620 A1 | 3/2017 | Sano et al. | |
| 2017/0229624 A1 | 8/2017 | Beppu et al. | |
| 2017/0317251 A1 | 11/2017 | Sweegers et al. | |
| 2018/0151786 A1 | 5/2018 | Beppu et al. | |
| 2018/0269361 A1* | 9/2018 | Hayashi | H10H 20/831 |
| 2018/0315901 A1 | 11/2018 | Lopez | |
| 2019/0081202 A1* | 3/2019 | Kasai | H10H 20/01 |
| 2019/0088829 A1* | 3/2019 | Takei | G02B 27/0977 |
| 2019/0140152 A1 | 5/2019 | Beppu et al. | |

| | | | |
|---|---|---|---|
| 2019/0169494 A1* | 6/2019 | Nakamura | C09K 11/08 |
| 2020/0176652 A1 | 6/2020 | Beppu et al. | |
| 2021/0175394 A1* | 6/2021 | Nakamura | C09K 11/7706 |

FOREIGN PATENT DOCUMENTS

| | | | |
|---|---|---|---|
| JP | 2014-072213 A | 4/2014 | |
| JP | 2015-012143 A | 1/2015 | |
| JP | 2015-026871 A | 2/2015 | |
| JP | 2015-084384 A | 4/2015 | |
| JP | 2015-177005 A | 10/2015 | |
| JP | 2016-122690 A | 7/2016 | |
| JP | 2017-054102 A | 3/2017 | |
| JP | 2017-533590 A | 11/2017 | |
| JP | 2018-531517 A | 10/2018 | |
| JP | 2018-195758 A | 12/2018 | |
| JP | 2019-016821 A | 1/2019 | |
| JP | 2019-057655 A | 4/2019 | |
| JP | 2019134187 A | 8/2019 | |
| WO | 2013/046662 A1 | 4/2013 | |

* cited by examiner

200

LIGHT-EMITTING DEVICE AND METHOD FOR MANUFACTURING SAME

CROSS-REFERENCE TO RELATED APPLICATIONS

This application is a U.S. national phase application of PCT/JP2021/004319 filed on Feb. 5, 2021, which claims priority to Japanese Patent Application No. 2020-027245 filed on Feb. 20, 2020. The entire disclosure of Japanese Patent Application No. 2020-027245 is hereby incorporated herein by reference.

TECHNICAL FIELD

Embodiments relates to a light-emitting device and a method of manufacturing the same.

BACKGROUND ART

There has been known a light-emitting device including a substrate, a light-emitting element provided on the substrate, a wavelength conversion layer provided on the light-emitting element, and a wall containing a light-reflective material and surrounding the wavelength conversion layer (for example, see Japanese Laid-Open Patent Publication No. 2018-195758 A). For such a light-emitting device, there is a need to inhibit a problem in which light propagates into the wall and the light propagating into the wall leaks from an upper surface of the wall.

SUMMARY

An object of an embodiment is to provide a light-emitting device in which leakage of light from an upper surface of a wall is reduced, and a method of manufacturing the light-emitting device.

A light-emitting device according to an embodiment includes: a substrate; a light-emitting element provided on the substrate, the light-emitting element emitting a first light; a wavelength conversion layer provided on the light-emitting element and containing a plurality of wavelength conversion particles adapted to convert a wavelength of a part of the first light and to emit a second light; a light-transmissive plate provided above the wavelength conversion layer; and a wall containing a light-reflective material, the wall surrounding the wavelength conversion layer and the light-transmissive plate and being in contact with a lateral surface of the light-transmissive plate at an inner surface of the wall, wherein an upper portion of the wavelength conversion layer includes protrusions and recesses resulting from the plurality of wavelength conversion particles; and an air layer is provided between the wavelength conversion layer and the light-transmissive plate.

A method of manufacturing a light-emitting device according to an embodiment includes: placing, on a substrate, a light-emitting element that emits a first light; disposing, on the light-emitting element, a wavelength conversion layer containing a plurality of wavelength conversion particles adapted to convert a wavelength of a part of the first light and to emit a second light, the disposing the wavelength conversion layer performed such that an upper portion of the wavelength conversion layer includes protrusions and recesses resulting from the plurality of wavelength conversion particles; disposing a light-transmissive plate above the wavelength conversion layer with an air layer provided between the light-transmissive plate and the wavelength conversion layer; providing a light-reflective material that is uncured surrounding the wavelength conversion layer and the light-transmissive plate; and forming a wall by curing the light-reflective material.

According to an embodiment, it is possible to provide a light-emitting device in which the occurrence of light leaking from an upper surface of a wall can be inhibited, and a method of manufacturing the light-emitting device.

DESCRIPTION OF EMBODIMENTS

A light-emitting device according to an embodiment includes: a substrate; a light-emitting element provided on the substrate, the light-emitting element emitting a first light; a wavelength conversion layer provided on the light-emitting element and including a plurality of wavelength conversion particles that convert a wavelength of a part of the first light and emit a second light; a light-transmissive plate provided above the wavelength conversion layer; and a wall including a light-reflective material, the wall surrounding the wavelength conversion layer and the light-transmissive plate and being in contact with a lateral surface of the light-transmissive plate at an inner surface of the wall, wherein an upper portion of the wavelength conversion layer includes protrusions and recesses resulting from the plurality of wavelength conversion particles; and an air layer is provided between the wavelength conversion layer and the light-transmissive plate.

A method of manufacturing a light-emitting device according to an embodiment includes: placing, on a substrate, a light-emitting element that emits a first light; disposing, on the light-emitting element, a wavelength conversion layer including a plurality of wavelength conversion particles adapted to convert a wavelength of a part of the first light and emit a second light, the disposing the wavelength conversion layer performed such that an upper portion of the wavelength conversion layer includes protrusions and recesses resulting from the plurality of wavelength conversion particles; disposing a light-transmissive plate above the wavelength conversion layer with an air layer provided between the light-transmissive plate and the wavelength conversion layer; providing a light-reflective material that is uncured surrounding the wavelength conversion layer and the light-transmissive plate; and forming a wall by curing the light-reflective material.

Figure 1:
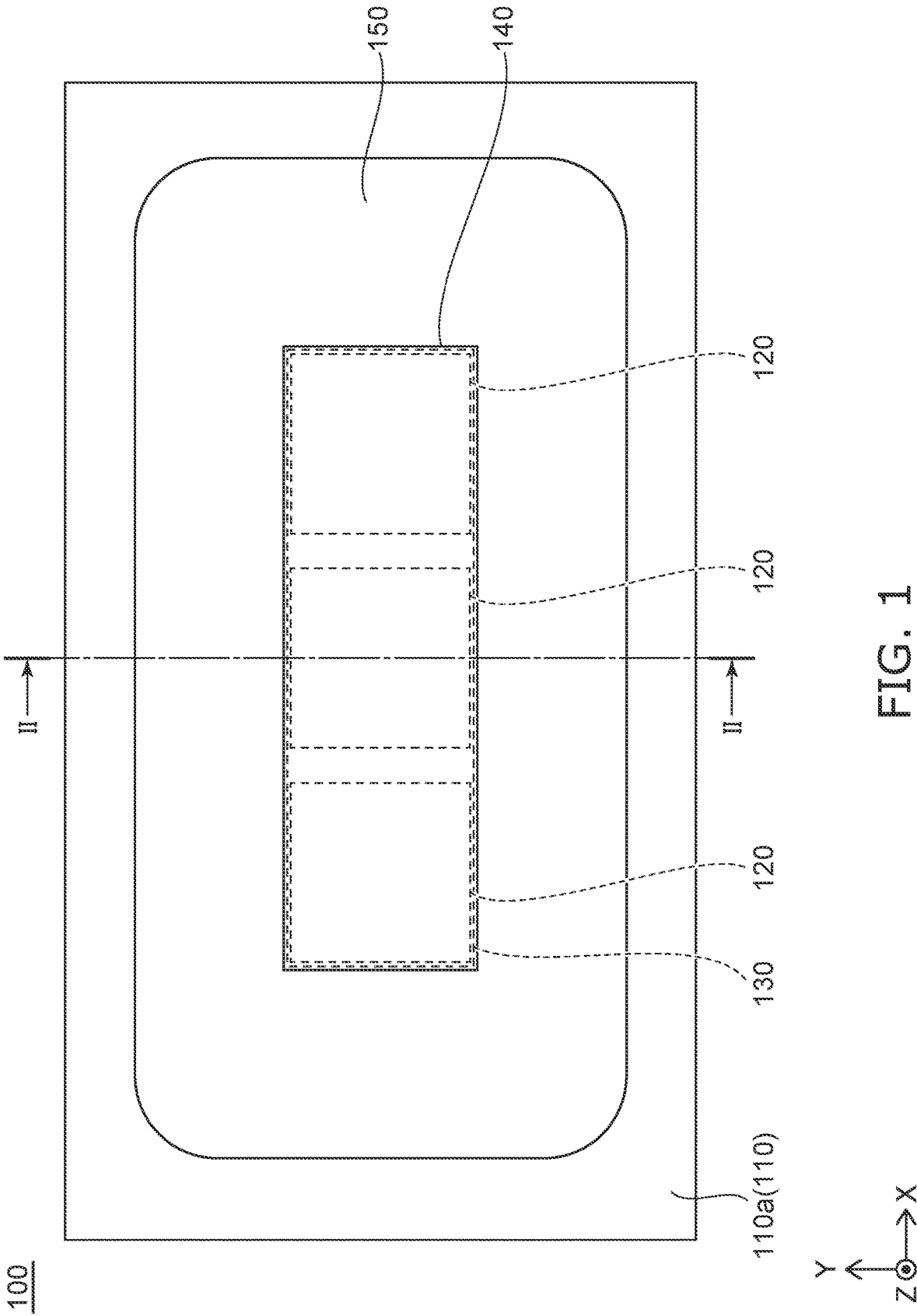
FIG. 1 is a schematic top view illustrating a light-emitting device according to a first embodiment.
Figure 2A:
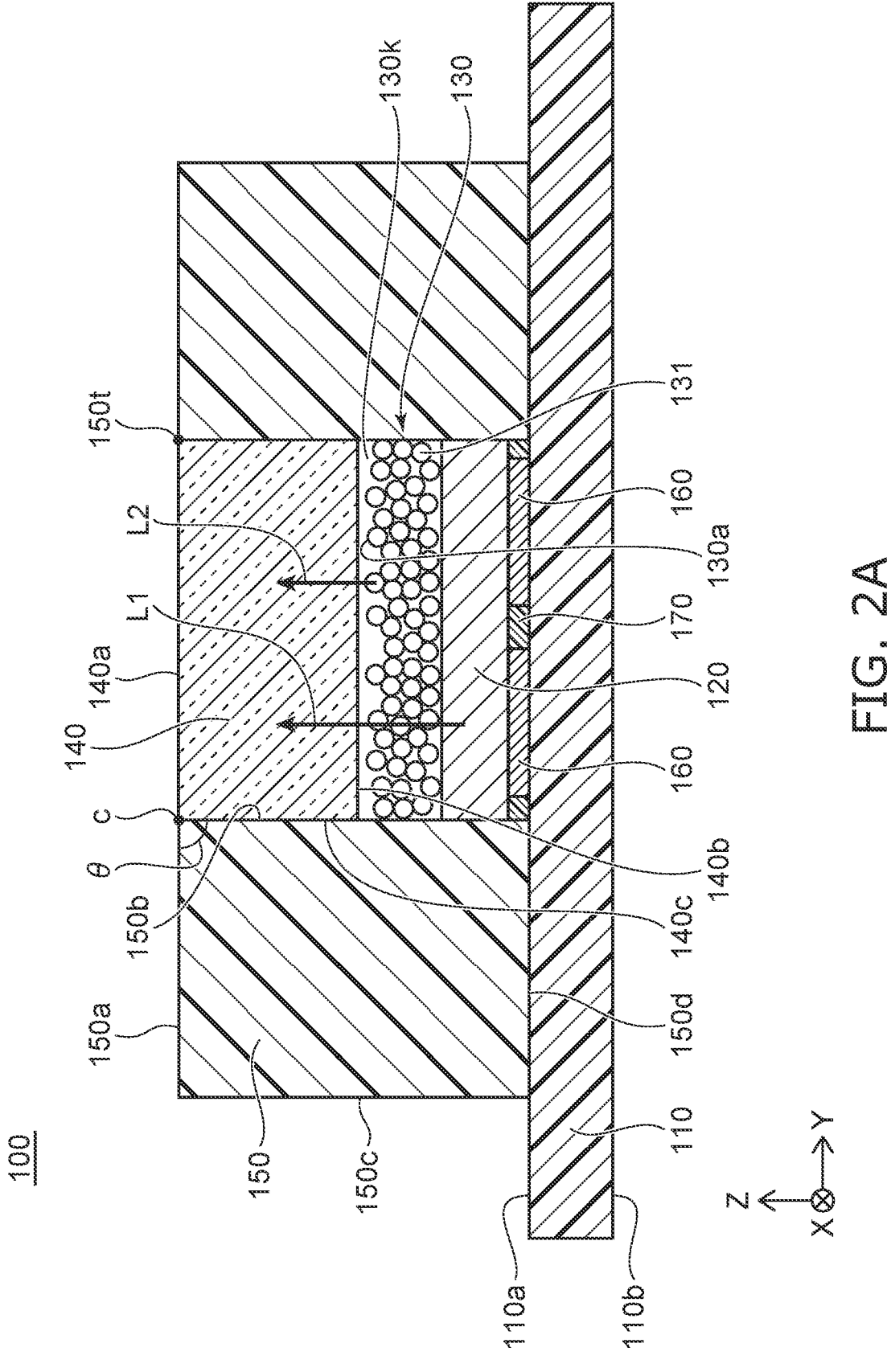
FIG. 2A is a schematic view illustrating an example of an end surface taken along line II-II in FIG. 1.

Next, a specific configuration of a light-emitting device according to each embodiment will be described. Hereinafter, in the present specification, an XYZ Cartesian coordinate system is employed for convenience of description. As illustrated in FIGS. 1 and 2A, a direction from a substrate 110 toward a light-emitting element 120 is referred to as a "Z direction". The Z direction is also referred to as an "upward direction". A direction opposite to the Z direction is also referred to as a "downward direction". One direction orthogonal to the Z direction is referred to as an "X direction". A direction orthogonal to the Z direction and the X direction is referred to as a "Y direction". Furthermore, a direction orthogonal to the Z direction, such as the X direction and the Y direction, is also referred to as a "lateral direction".

First Embodiment

A light-emitting device 100 according to a first embodiment will be described.

FIG. 1 is a schematic top view illustrating the light-emitting device 100 according to the present embodiment.

FIG. 2A is a schematic view illustrating an example of an end surface taken along line II-II in FIG. 1.

Figure 2B:
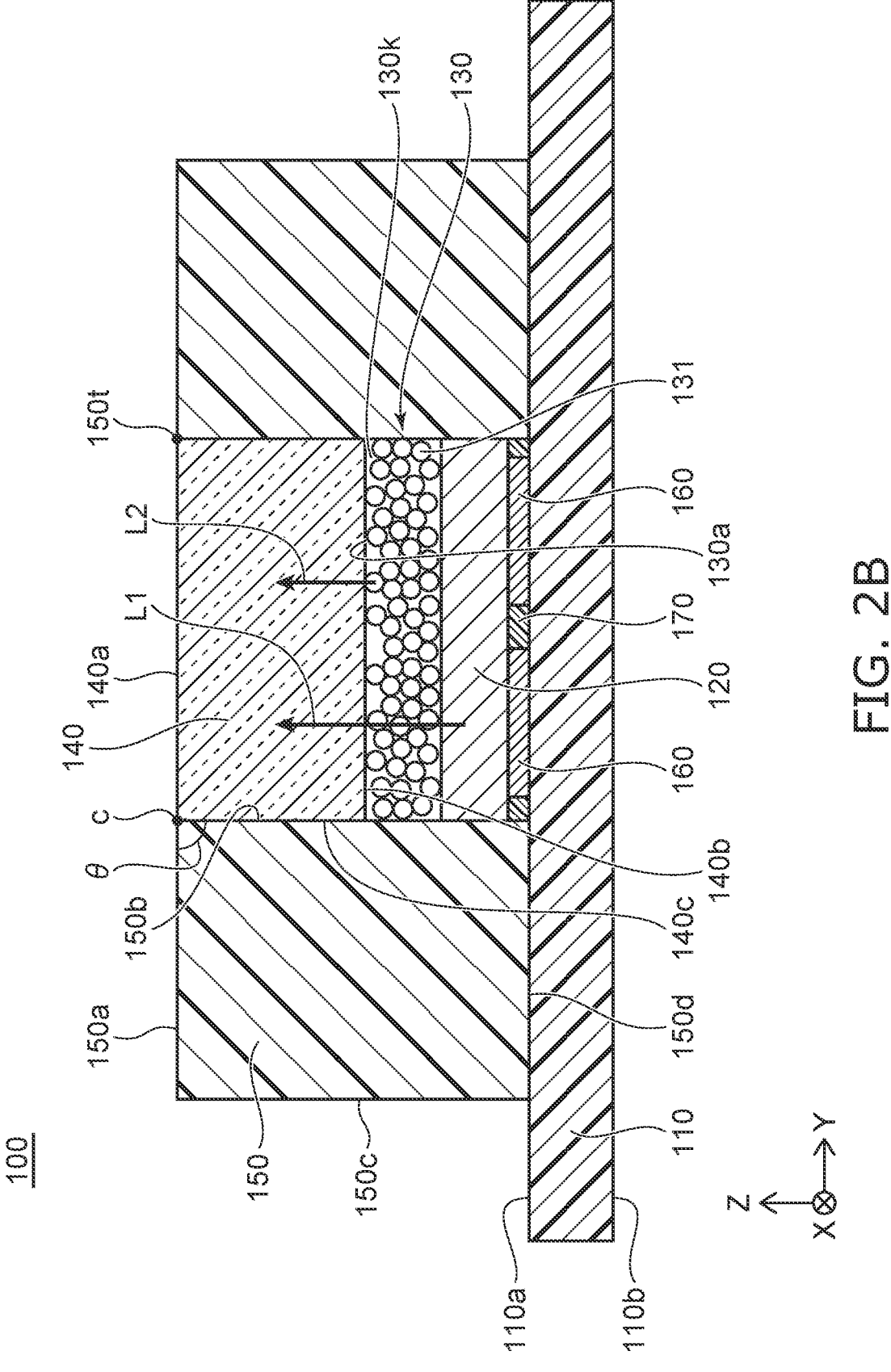
FIG. 2B is a schematic view illustrating another example of an end surface taken along line II-II in FIG. 1.

FIG. 2B is a schematic view illustrating another example of an end surface taken along line II-II in FIG. 1.

As illustrated in FIGS. 1 and 2A, the light-emitting device 100 includes the substrate 110, the light-emitting element 120, a wavelength conversion layer 130, a light-transmissive plate 140, and a wall 150.

As illustrated in FIG. 2A, the light-emitting element 120 is provided on the substrate 110 and emits a first light L1. The wavelength conversion layer 130 is provided on the light-emitting element 120. The wavelength conversion layer 130 includes a plurality of wavelength conversion particles 131 adapted to convert a wavelength of a part of the first light L1 and to emit a second light L2. The light-transmissive plate 140 is provided on the wavelength conversion layer 130. The wall 150 surrounds the wavelength conversion layer 130 and the light-transmissive plate 140. An inner surface 150b of the wall 150 is in contact with a lateral surface 140c of the light-transmissive plate 140. The wall 150 contains a light-reflective material.

An upper portion of the wavelength conversion layer 130 has protrusions and recesses resulting from the wavelength conversion particles 131. An air layer 130k is provided between the wavelength conversion layer 130 and the light-transmissive plate 140. Each component of the light-emitting device 100 will be described in detail below.

The substrate 110 is, for example, a wiring substrate in which wiring that connects to the light-emitting element 120 is disposed in a base material formed from a resin material. However, the base material of the substrate 110 is not limited thereto, and ceramics or the like can be used.

The surface of the substrate 110 includes an upper surface 110a and a lower surface 110b, as illustrated in FIG. 2A. The upper surface 110a and the lower surface 110b are flat surfaces and are substantially parallel in the X direction and the Y direction. As illustrated in FIG. 1, the shape of the substrate 110 in a top view is quadrangular. However, the shape of the substrate 110 in top view is not limited thereto.

Three of the light emitting elements 120 are mounted on the upper surface 110a of the substrate 110. The three light emitting elements 120 are arranged in array along the X direction. However, the number of the light emitting elements 120 provided on the substrate 110 is not particularly limited as long as the number is one or more. Furthermore, if a plurality of the light emitting elements 120 are provided in the light-emitting device 100, the plurality of light emitting elements 120 can be arranged in array not only in the X direction, but also in the Y direction. The shape of each of the light emitting elements 120 in a top view is quadrangular. However, the shape of the light-emitting element 120 is not limited thereto.

As illustrated in FIG. 2A, in the present embodiment, the light-emitting element 120 is a light emitting diode (LED) in which a front surface side of a semiconductor layer laminated on a growth substrate of the light-emitting element 120 is mounted face down (FD) on the substrate 110. A conductive joint member 160 is provided between each of the light-emitting elements 120 and the substrate 110. Each of the light-emitting elements 120 is joined to the substrate 110 by using the joint member 160.

The light-emitting element 120 emits blue light as the first light L1. However, the color of the first light L1 is not limited to blue.

A light-shielding layer 170 is provided between each of the light-emitting elements 120 and the substrate 110. The light-shielding layer 170 includes a base material formed of a resin material, and a plurality of fillers dispersed in the base material. A thermosetting resin such as a silicone resin or an epoxy resin can be used as the resin material. A light-reflective material such as titanium oxide ($TiO_2$) can be used as the filler. However, the light-shielding layer 170 need not necessarily be provided between each of the light-emitting elements 120 and the substrate 110.

Figure 3:
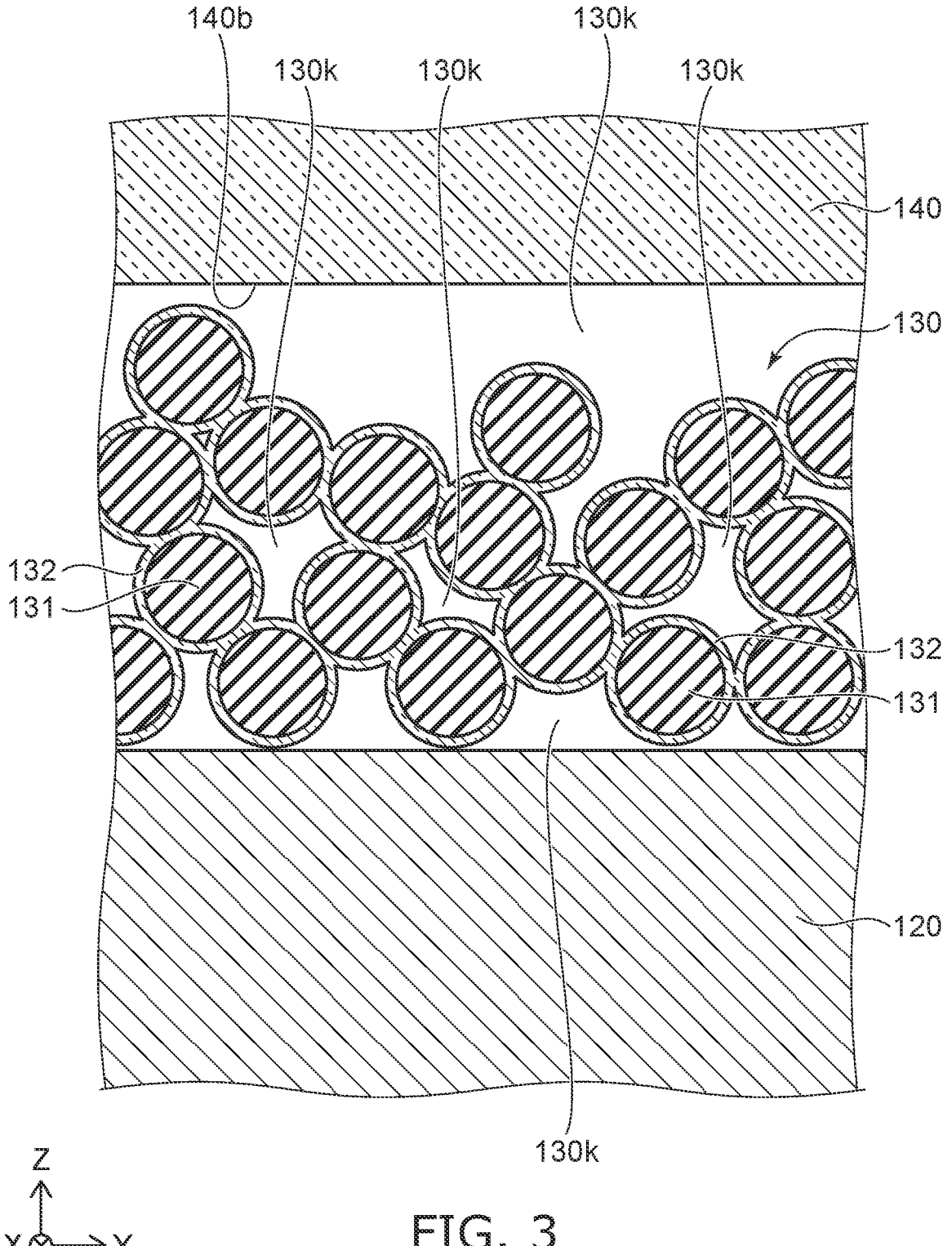
FIG. 3 is an enlarged schematic end view illustrating a part of a light-emitting element, a part of a wavelength conversion layer, and a part of a light-transmissive plate illustrated in FIG. 2A.

FIG. 3 is an enlarged schematic end view illustrating a part of the light-emitting element, a part of the wavelength conversion layer, and a part of the light-transmissive plate illustrated in FIG. 2A.

The wavelength conversion layer 130 is provided on the upper surface of each of the light emitting elements 120. The wavelength conversion layer 130 includes a plurality of wavelength conversion particles 131. The upper portion of the wavelength conversion layer 130 has protrusions and recesses resulting from the plurality of wavelength conversion particles 131.

A yellow phosphor that absorbs the blue first light L1 and emits the yellow second light L2 can be used for the wavelength conversion particles 131. The wavelength conversion layer 130 emits the second light L2 and transmits a part of the first light L1. Therefore, the light-emitting device 100 emits white light in which the first light L1 and the second light L2 are mixed.

However, the wavelength conversion particles 131 are not limited to the yellow phosphor. A red phosphor that converts the wavelength of the first light L1 to emit red light, or a green phosphor that converts the wavelength of the first light L1 to emit green light can be used as the wavelength conversion particles 131. In this case, the light-emitting device 100 can emit white light by mixing the red color of the light emitted by the red phosphor, the green color of the light emitted by the green phosphor, and the blue color of the first light L1. The light-emitting device 100 can also emit single color light other than white light.

The wavelength conversion particles 131 are covered by a glass layer 132. The glass layer 132 is formed of silica ($SiO_2$). The glass layer 132 holds the wavelength conversion particles 131 in the wavelength conversion layer 130 by bonding the wavelength conversion particles 131 to each other and bonding the light-emitting element 120 and the wavelength conversion particles 131. The glass layer 132 protects the wavelength conversion particles 131 from moisture in the air and other substances. An air layer 130k (a gap) is formed between the wavelength conversion particles 131 the light-transmissive plate 140, between the wavelength conversion particles 131, and between the light-emitting element 120 and the wavelength conversion particles 131.

Next, an example of the dimensions of each of the components will be described.

The thickness of the wavelength conversion layer 130 is in a range from 20 μm to 200 μm, for example. The diameter of each of the wavelength conversion particles 131 is in a range from 2 to 23 μm, for example, or in a range from 5 to 15 μm, for example. The thickness of the glass layer 132 is in a range from 1 to 5 μm, for example.

The configuration of the wavelength conversion layer 130 is not limited to that described above as long as it has protrusions and recesses resulting from the wavelength conversion particles 131 on at least the upper portion. For example, the wavelength conversion particles 131 need not necessarily be covered by the glass layer 132. In this case, the wavelength conversion particles 131 can be held in the wavelength conversion layer 130 by using a binder formed of a resin material such as silicone resin to bond the wavelength conversion particles 131 to each other and bond the light-emitting element 120 and the wavelength conversion particles 131. Furthermore, the wavelength conversion particles 131 can be held in the wavelength conversion layer 130 by adhering the wavelength conversion particles 131 to each other and adhering the light-emitting element 120 and the wavelength conversion particles 131 through electrostatic adhesion, without using a binder, for example.

As illustrated in FIG. 2A, the light-transmissive plate 140 is provided above the wavelength conversion layer 130. The light-transmissive plate 140 protects the wavelength conversion layer 130 from dust and dirt, moisture in the air, and other substances. The light-transmissive plate 140 is light-transmissive with respect to the second light L2 emitted from the wavelength conversion layer 130. "Light-transmissive" means allowing 40% or more, preferably 60% or more, and even more preferably 80% or more of the second light L2 to pass through. As the material constituting the light-transmissive plate 140, a light-transmissive material such as glass, sapphire, a silicone molded body, and the like can be used.

The shape of the light-transmissive plate 140 is a rectangular parallelepiped. The surface of the light-transmissive plate 140 includes an upper surface 140a, a lower surface 140b, and the lateral surface 140c. The upper surface 140a is a flat surface. The upper surface 140a is parallel to the upper surface 110a of the substrate 110. The term "parallel" does not mean "exactly parallel", but can include variations in the manufacturing process and can mean "substantially parallel".

The lower surface 140b is located on a side opposite to the upper surface 140a and faces the wavelength conversion layer 130. The lower surface 140b is a flat surface and is parallel to the upper surface 110a of the substrate 110. The lateral surface 140c is located between the upper surface 140a and the lower surface 140b and is in contact with the upper surface 140a and the lower surface 140b. The lower surface 140b is separated from the wavelength conversion layer 130 in the present embodiment. However, as illustrated in FIG. 2B, a part of the lower surface 140b may be in contact with the wavelength conversion layer 130.

The lateral surface 140c is perpendicular to the upper surface 140a. The term "perpendicular" does not mean "exactly perpendicular" and can include variations in the manufacturing process and can mean "substantially perpendicular".

As illustrated in FIGS. 1 and 2A, in the present embodiment, the light-emitting element 120, the wavelength conversion layer 130, and the light-transmissive plate 140 are surrounded by the wall 150. The wall 150 has a tubular shape.

The wall 150 includes a base material formed of a resin material and a plurality of fillers formed of a light-reflective material. A thermosetting resin such as a silicone resin or an epoxy resin can be used as the resin material of the wall 150. Silicon oxide ($SiO_2$), titanium oxide ($TiO_2$), aluminum (Al), silver (Ag), or the like can be used as the light-reflective material of the wall 150.

The surface of the wall 150 includes an upper surface 150a, an inner surface 150b, an outer surface 150c, and a lower surface 150d.

The upper surface 150*a* is a flat surface and is parallel to the upper surface 110*a* of the substrate 110. The upper surface 150*a* is in contact with inner surface 150*b* and outer surface 150*c*. The upper surface 150*a* is flush with the upper surface 140*a* of the light-transmissive plate 140.

In the present embodiment, the inner surface 150*b* surrounds the light-emitting element 120, the wavelength conversion layer 130, and the light-transmissive plate 140. The inner surface 150*b* is in contact with a lateral surface of the light-emitting element 120, a lateral end portion of the wavelength conversion layer 130, and the lateral surface 140*c* of the light-transmissive plate 140. The region in the inner surface 150*b* including at least an upper end 150*t* located highest up is in contact with the lateral surface 140*c* of the light-transmissive plate 140 and thus is perpendicular to the upper surface 110*a* of the substrate 110.

The outer surface 150*c* surrounds the upper surface 150*a*. The outer surface 150*c* is perpendicular to the upper surface 110*a* of the substrate 110. However, the shape of the outer surface 150*c* is not particularly limited. For example, the outer surface 150*c* may be inclined with respect to the Z axis.

The lower surface 150*d* is located opposite the upper surface 150*a*. In the present embodiment, the lower surface 150*d* is in contact with the upper surface 110*a* of the substrate 110.

The wall 150 surrounds the light-transmissive plate 140 provided above the wavelength conversion layer 130. Thus, the upper surface 150*a* is located above an upper surface 130*a* of the wavelength conversion layer 130. The distance between the upper surface 130*a* of the wavelength conversion layer 130 and the upper surface 150*a* of the wall 150 is preferably in a range of 50 μm to 2000 μm. The "distance between the upper surface 130*a* of the wavelength conversion layer 130 and the upper surface 150*a* of the wall 150" refers to the shortest distance in the Z direction between the upper surface 130*a* of the wavelength conversion layer 130 and the upper surface 150*a* of the wall 150.

In the present embodiment, the upper surface 150*a* is parallel to the upper surface 110*a* of the substrate 110, and a region of the inner surface 150*b* that includes the upper end 150*t* is perpendicular to the upper surface 110*a* of the substrate 110. Thus, the angle θ of a corner portion c between the upper surface 150*a* and the inner surface 150*b* is 90 degrees. However, the angle θ of the corner portion c is not limited thereto.

Next, operation of the light-emitting device 100 according to the present embodiment will be described.

Figure 4A:
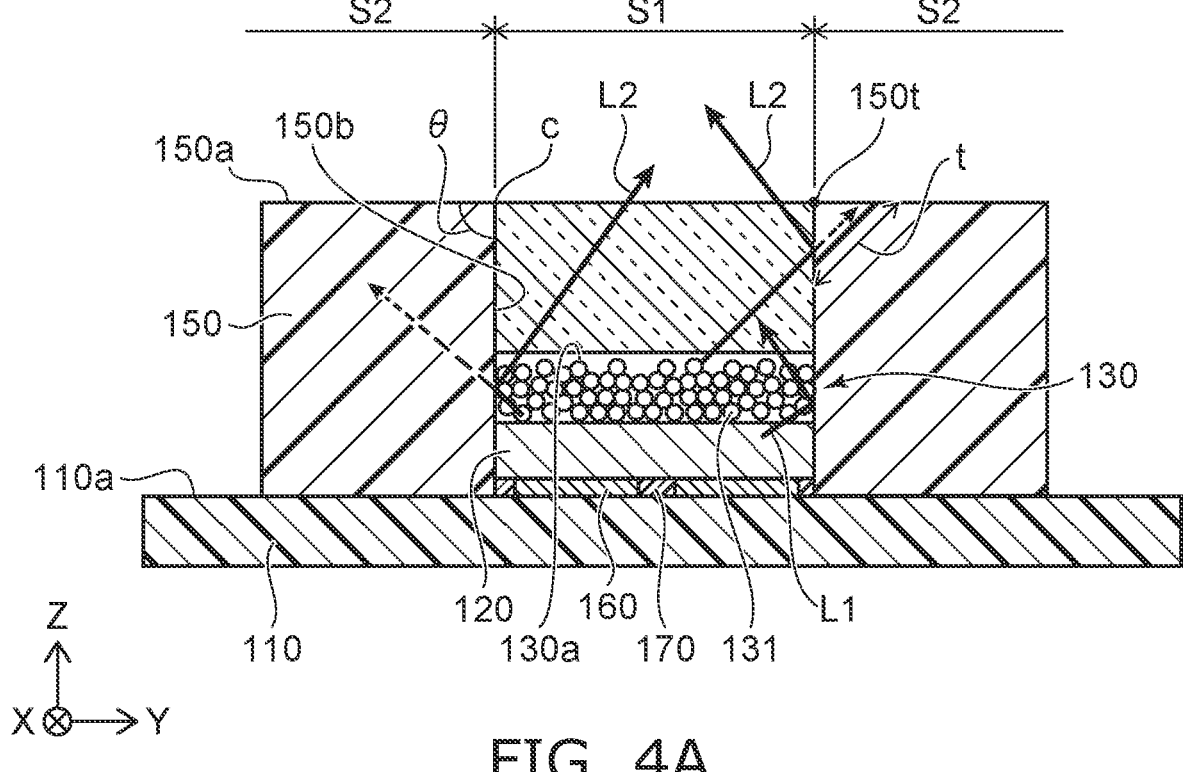
FIG. 4A is a schematic end view illustrating an example of a path of light at an end surface taken along the line II-II of FIG. 1.

FIG. 4A is a schematic diagram illustrating an example of a path of light at an end surface taken along the line II-II of FIG. 1. The wall 150 surrounds the light-emitting element 120 and the wavelength conversion layer 130. Thus, when the light-emitting element 120 is illuminated, some of the first light L1 emitted from the light-emitting element 120 and some of the second light L2 emitted from the wavelength conversion layer 130 are reflected by the wall 150.

In particular, on the inner surface 150*b* of the wall 150, the luminance of the incident second light L2 is higher closer to a region adjacent to the wavelength conversion layer 130. Thus, the second light L2 easily propagates from a region of the inner surface 150*b* of the wall 150 adjacent to the wavelength conversion layer 130 into the wall 150. In the present embodiment, the wall 150 surrounds the light-transmissive plate 140 provided above the wavelength conversion layer 130 so that the upper surface 140*a* of the light-transmissive plate 140 and the upper surface 150*a* of the wall 150 are flush and is positioned above the upper surface 130*a* of the wavelength conversion layer 130. Thus, even if the second light L2 propagates from the region of the inner surface 150*b* of the wall 150 adjacent to the wavelength conversion layer 130 into the wall 150, the propagated second light L2 is attenuated in the wall 150, and emission of the second light L2 from the upper surface 150*a* of the wall 150 can be suppressed. As a result, the second light L2 propagating in the wall 150 can be inhibited from leaking from the upper surface 150*a* of the wall 150.

Further, in the present embodiment, the angle θ of the corner portion c is 90 degrees. Thus, compared to a case in which the angle θ of the corner portion c is less than 90 degrees, a thickness t of the corner portion c (the distance between the upper surface 140*a* and the inner surface 150*b* in the vicinity of the corner portion c) can be increased. As a result, even if the second light L2 propagates into the wall 150 from a region of the inner surface 150*b* of the wall 150 near the corner portion c, the propagated second light L2 is attenuated in the wall 150, and the second light L2 can be inhibited from leaking from the upper surface 150*a*.

Thus, if light is inhibited from leaking from the upper surface 150*a* of the wall 150, brightness of a peripheral region S2 surrounding a region S1 directly above the light-emitting element 120 and the wavelength conversion layer 130 can be inhibited from becoming brighter. Thus, the contrast between the peripheral region S2 and the region S1 directly above the light-emitting element 120 and the wavelength conversion layer 130 can be increased.

Further, in the present embodiment, the region of the inner surface 150*b* of the wall 150 including the upper end 150*t* is perpendicular to the upper surface 110*a* of the substrate 110. Therefore, the light distribution angle can be a narrow angle, and thus, the luminance of the light-emitting device 100 can be enhanced.

Figure 4B:
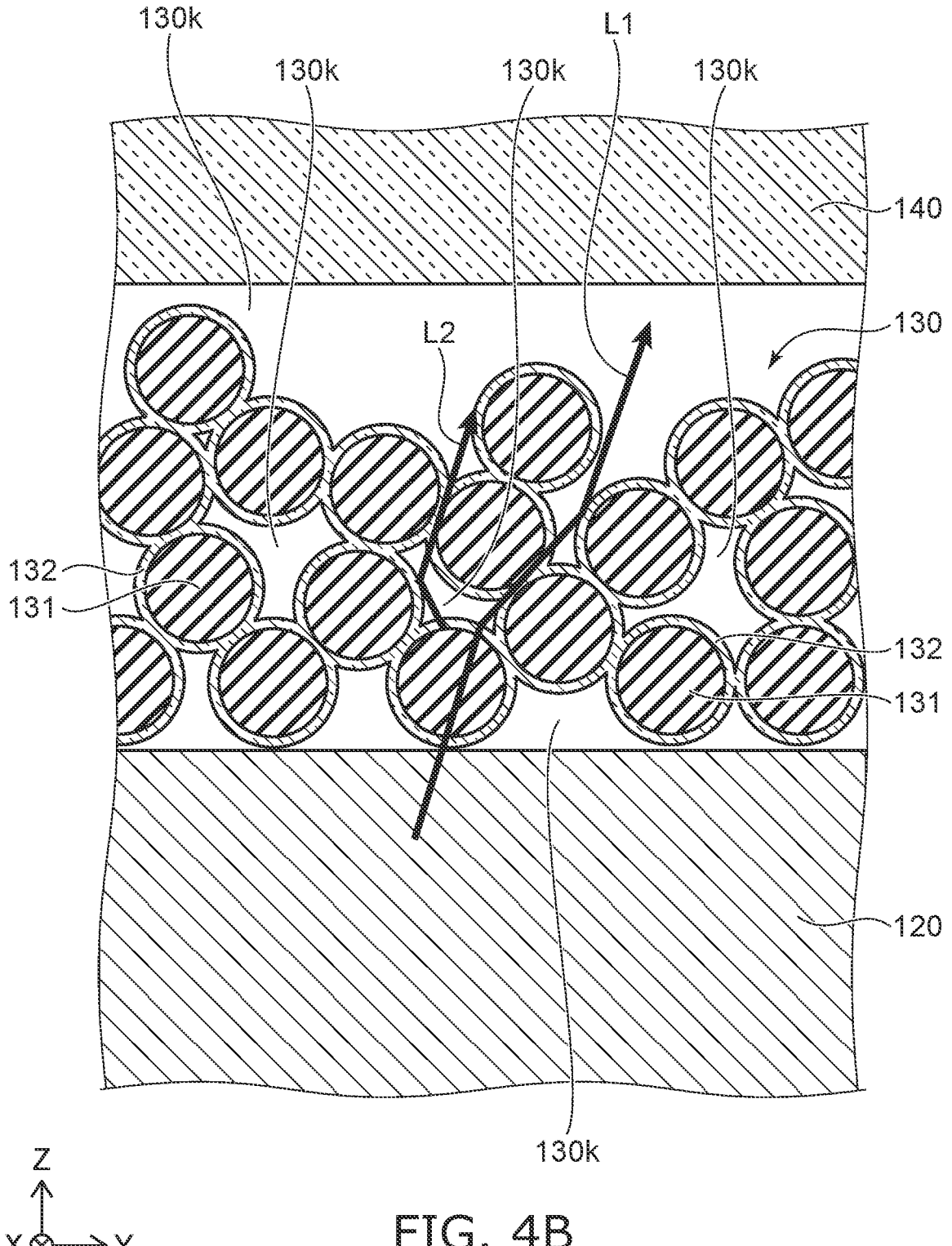
FIG. 4B is a schematic diagram illustrating an example of a path of light at an end surface in which a part of the light-emitting element, a part of the wavelength conversion layer, and a part of the light-transmissive plate in FIG. 2A are illustrated in an enlarged manner.

FIG. 4B is a schematic diagram illustrating an example of a path of light at an end surface in which a part of the light-emitting element, a part of the wavelength conversion layer, and a part of the light-transmissive plate in FIG. 2A are illustrated in an enlarged manner.

In the present embodiment, the wavelength conversion particles 131 are covered by the glass layer 132. Therefore, when the first light L1 emitted from the light-emitting element 120 and the second light L2 emitted from the wavelength conversion layer 130 are incident on the glass layer 132 from the air layer 130*k* in the wavelength conversion layer 130, the first light L1 and the second light L2 are likely to be reflected at a boundary surface between the air layer 130*k* and the glass layer 132. Thus, propagation of the first light L1 and the second light L2 in the lateral direction is blocked in the wavelength conversion layer 130, and the light is emitted from the region directly above the light-emitting element 120 and the wavelength conversion layer 130. Thus, the contrast between the peripheral region S2 and the region S1 directly above the light-emitting element 120 and the wavelength conversion layer 130 can be increased.

Next, a method of manufacturing the light-emitting device 100 according to the present embodiment will be described.

FIGS. 5A to 5E are schematic diagrams illustrating a method of manufacturing the light-emitting device according to the present embodiment.

Figure 5A:
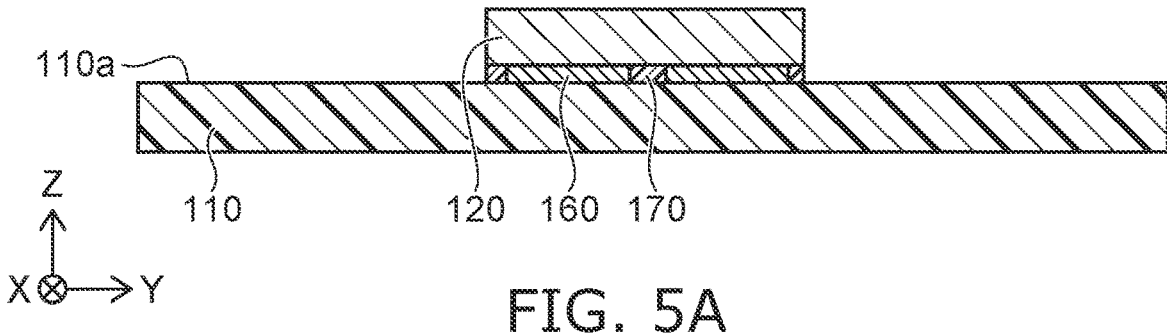
FIG. 5A is a schematic diagram illustrating a method of manufacturing a light-emitting device according to a first embodiment.

First, as illustrated in FIG. 5A, the light-emitting element 120 is mounted on the substrate 110. In the present embodiment, the light-emitting element 120 is joined to the substrate 110 by the conductive joint member 160. In the present embodiment, the light-shielding layer 170 is provided between the light-emitting element 120 and the substrate 110.

Figure 5B:
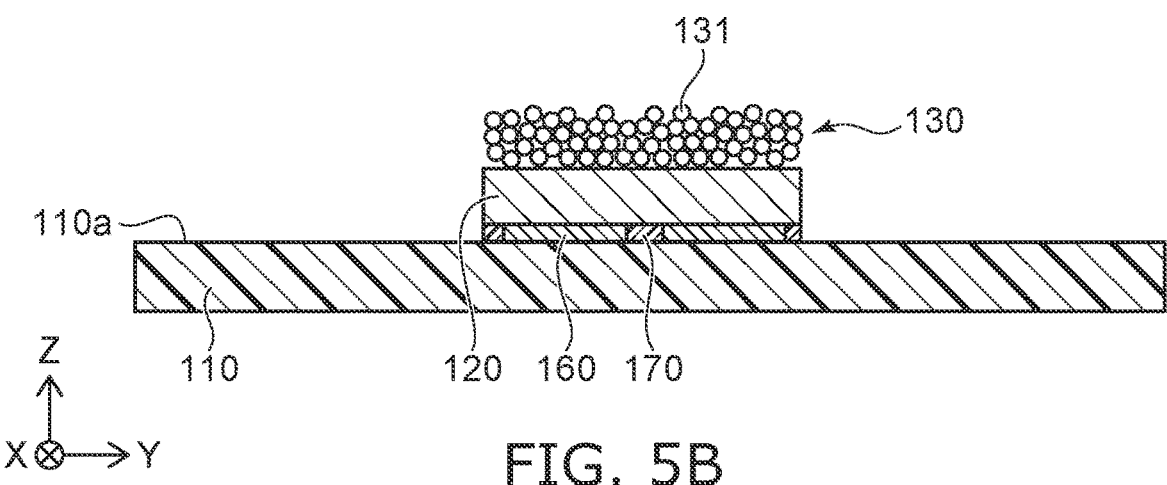
FIG. 5B is a schematic diagram illustrating the method of manufacturing the light-emitting device according to the first embodiment.

Subsequently, as illustrated in FIG. 5B, the wavelength conversion layer 130 is arranged on the light-emitting element 120. The wavelength conversion layer 130 is provided by spraying a slurry material including the plurality of wavelength conversion particles 131.

Specifically, a mask material is provided surrounding the light-emitting element 120, the slurry material is sprayed onto the light-emitting element 120, and the mask material is removed. The slurry material contains polysilazane, the plurality of wavelength conversion particles 131, and an organic solvent. Heptane or dibutyl ether, for example, is used as the organic solvent. Note that a slurry material not containing the organic solvent can be used. The slurry material contains no resin material. Subsequently, the base onto which the slurry material is sprayed is heated or left at room temperature to convert the polysilazane into silica.

Thus, the wavelength conversion particles 131 are covered with the glass layer 132 containing the silica and the air layer 130k is formed between the wavelength conversion particles 131. Thus, the wavelength conversion layer 130 is formed on the light-emitting element 120.

The method of disposing the wavelength conversion layer is not limited to the method described above. For example, the slurry material to be sprayed need not contain polysilazane and can contain a binder including a resin material such as a silicone resin. The wavelength conversion layer can be provided by electrostatically adhering the wavelength conversion particles to each other and electrostatically adhering the wavelength conversion particles and the light-emitting element.

Figure 5C:
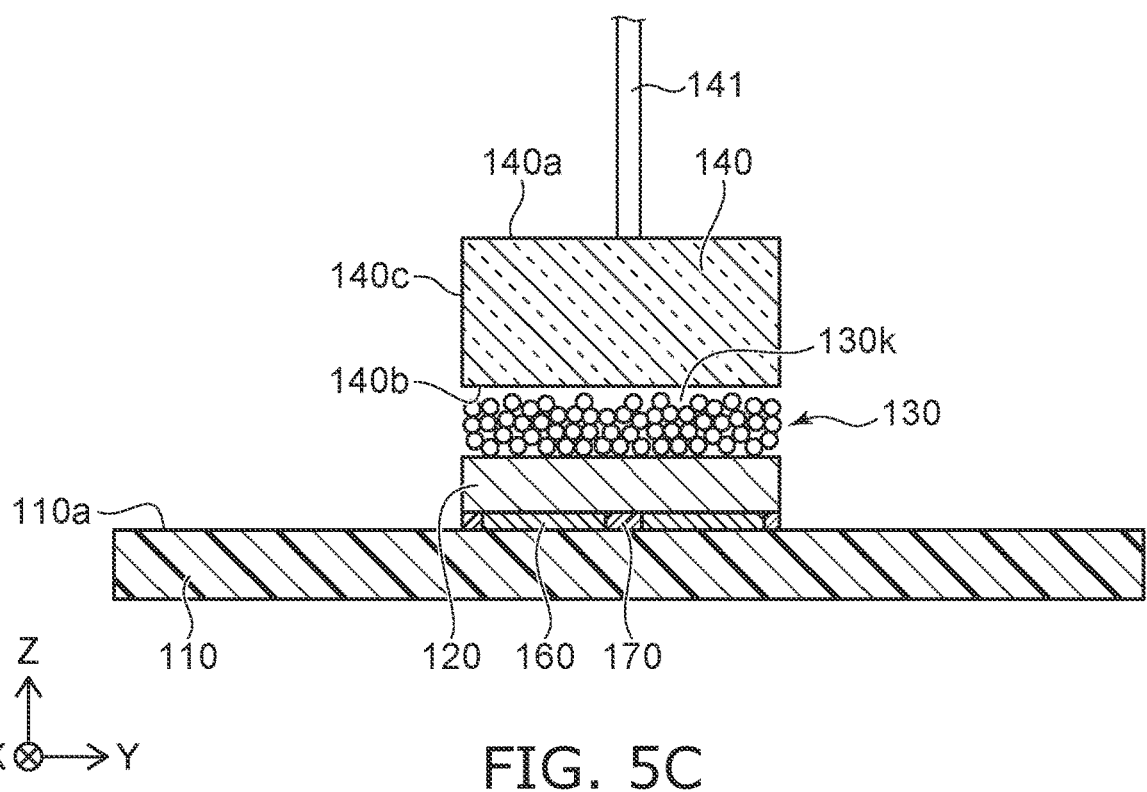
FIG. 5C is a schematic diagram illustrating the method of manufacturing the light-emitting device according to the first embodiment.

Subsequently, as illustrated in FIG. 5C, the light-transmissive plate 140 is arranged on the wavelength conversion layer 130. The light-transmissive plate 140 is held in a holding tool 141 and is not adhered to the wavelength conversion layer 130 by an adhesive or the like. That is, the light-transmissive plate 140 is disposed with an air layer 130k interposed between the light-transmissive plate 140 and the wavelength conversion layer 130.

The light-transmissive plate 140 is arranged so that the upper surface 140a and the lower surface 140b are parallel to the upper surface 110a of the substrate 110. Also, the light-transmissive plate 140 is arranged at a position overlapping the wavelength conversion layer 130 and three light emitting elements 120 in a top view. The light-emitting element 120 and the wavelength conversion layer 130 can be visually recognized from above the light-transmissive plate 140 in a state where the light-transmissive plate 140 is placed on the wavelength conversion layer 130. Thus, the light-transmissive plate 140 can be easily positioned with respect to the light-emitting element 120 and the wavelength conversion layer 130.

Figure 5D:
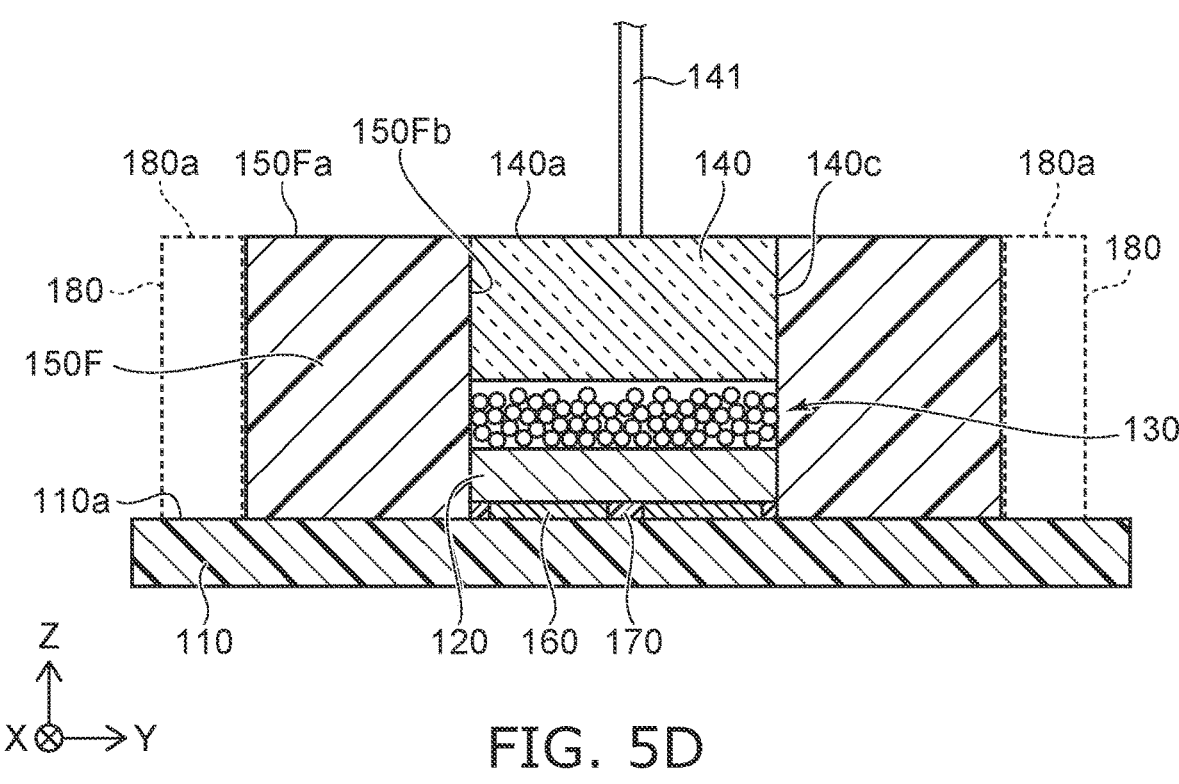
FIG. 5D is a schematic diagram illustrating the method of manufacturing the light-emitting device according to the first embodiment.

Subsequently, as illustrated in FIG. 5D, an uncured light-reflective material 150F is provided surrounding the wavelength conversion layer 130 and the light-transmissive plate 140.

The uncured light-reflective material 150F includes a base material formed of an uncured resin material, and a filler formed of a light-reflective material. A thermosetting resin such as a silicone resin or an epoxy resin can be used as the resin material of the light-reflective material 150F. Silicon oxide ($SiO_2$), titanium oxide ($TiO_2$), aluminum (Al), silver (Ag), or the like can be used as the light-reflective material of the light-reflective material 150F. The light-reflective material 150F can further include a thickening agent. The term "uncured" means that the light-reflective material 150F is at least not completely cured and is flexible enough to be deformed to match the shape of the light-transmissive plate 140. The "cured light-reflective material 150F" refers to the light-reflective material 150F which is completely cured and corresponds to the wall 150.

When the light-reflective material 150F is provided, a frame member 180 surrounding the light-transmissive plate 140 and the wavelength conversion layer 130 may be provided at a position separated from the light-transmissive plate 140 and the wavelength conversion layer 130, and the light-reflective material 150F may be provided between the light-transmissive plate 140 and the wavelength conversion layer 130 and the frame member 180.

When the upper end of an inner surface 150Fb of the uncured light-reflective material 150F is positioned below the upper end of the lateral surface 140c of the light-transmissive plate 140, the uncured light-reflective material 150F wets and spreads above the lateral surface 140c, and an upper surface 150Fa of the uncured light-reflective material 150F is recessed toward the substrate 110. In this case, the angle θ of the corner portion c of the cured light-reflective material 150F (that is, the wall 150) is reduced to less than 90 degrees. Thus, in the present embodiment, the uncured light-reflective material 150F is provided such that the upper end of the inner surface 150Fb of the uncured light-reflective material 150F is located at the same position in the vertical direction as the upper end of the upper surface 140a of the light-transmissive plate 140. This makes it possible to suppress the angle θ of the corner portion c from being less than 90 degrees.

Further, in the present embodiment, the upper surface 150Fa of the uncured light-reflective material 150F is flush with the upper surface 150a of the light-transmissive plate 140 and an upper surface 180a of the frame member 180. With this configuration, the upper surface 150a of the cured light-reflective material 150F (that is, the wall 150) can be made parallel to the upper surface 110a of the substrate 110. When it is expected that the upper surface 150a of the cured light-reflective material 150F is pulled in the direction toward the substrate 110 more than the upper surface 150Fa of the uncured light-reflective material 150F, the uncured light-reflective material 150F may be provided such that the upper surface 150Fa of the uncured light-reflective material 150F protrudes outward in the direction away from the substrate 110. In this case, the upper surface 150Fa can be flattened by polishing or the like after the light-reflective material 150F is cured.

Subsequently, the light-reflective material 150F is cured. If the base material of the light-reflective material 150F is a thermosetting resin, the light-reflective material 150F is cured by being heated. The heating temperature is in a range from 150° C. to 200° C., for example. However, the curing method can be appropriately selected according to the material of the light-reflective material 150F. For example, the resin in the light-reflective material 150F can be formed of an ultraviolet curable resin and cured by ultraviolet rays.

Figure 5E:
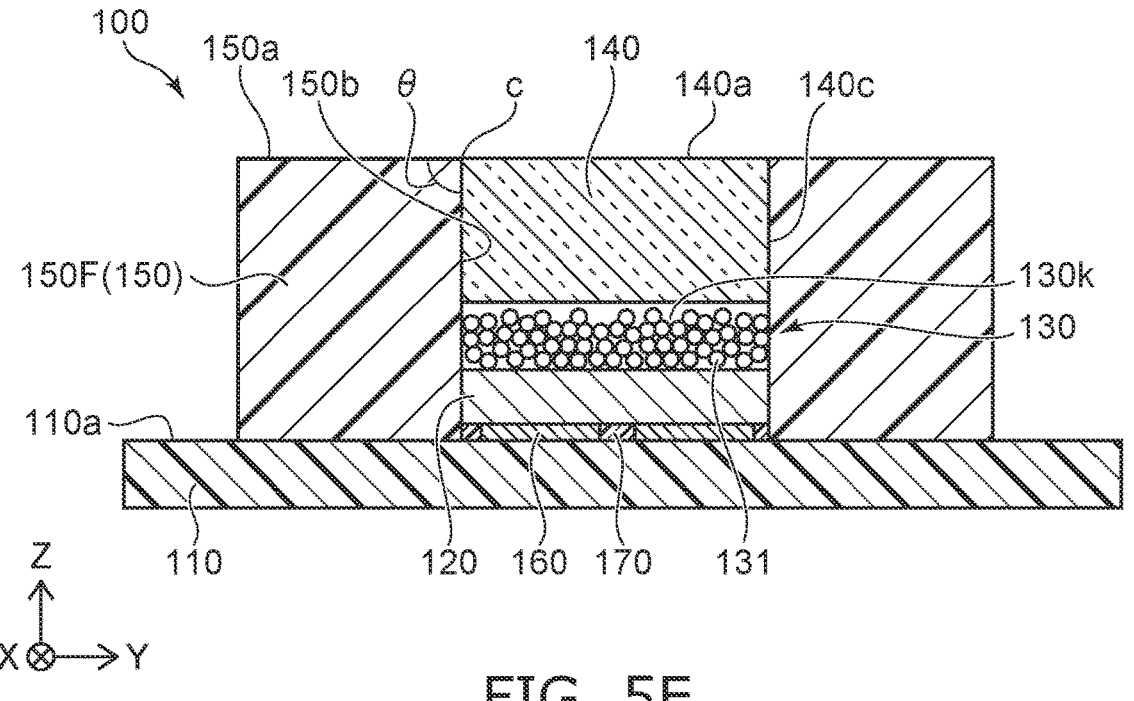
FIG. 5E is a schematic diagram illustrating the method of manufacturing the light-emitting device according to the first embodiment.

Subsequently, as illustrated in FIG. 5E, the holding tool 141 and the frame member 180 are removed from the substrate 110. Accordingly, the upper portion of the wavelength conversion layer 130 has protrusions and recesses due to the wavelength conversion particles 131, and the light-emitting device 100 in which the air layer 130k is interposed between the wavelength conversion layer 130 and the light-transmissive plate 140 is formed.

Figure 6A:
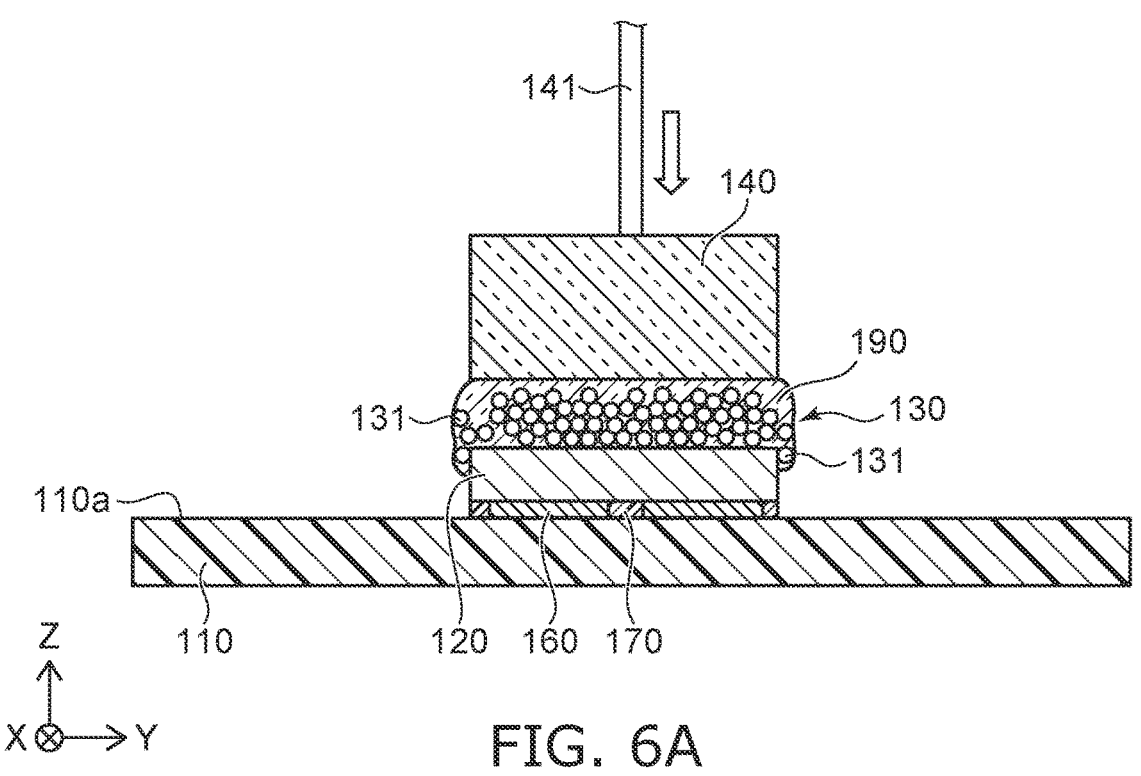
FIG. 6A is a schematic diagram illustrating a method of manufacturing a light-emitting device according to a reference example.
Figure 6B:
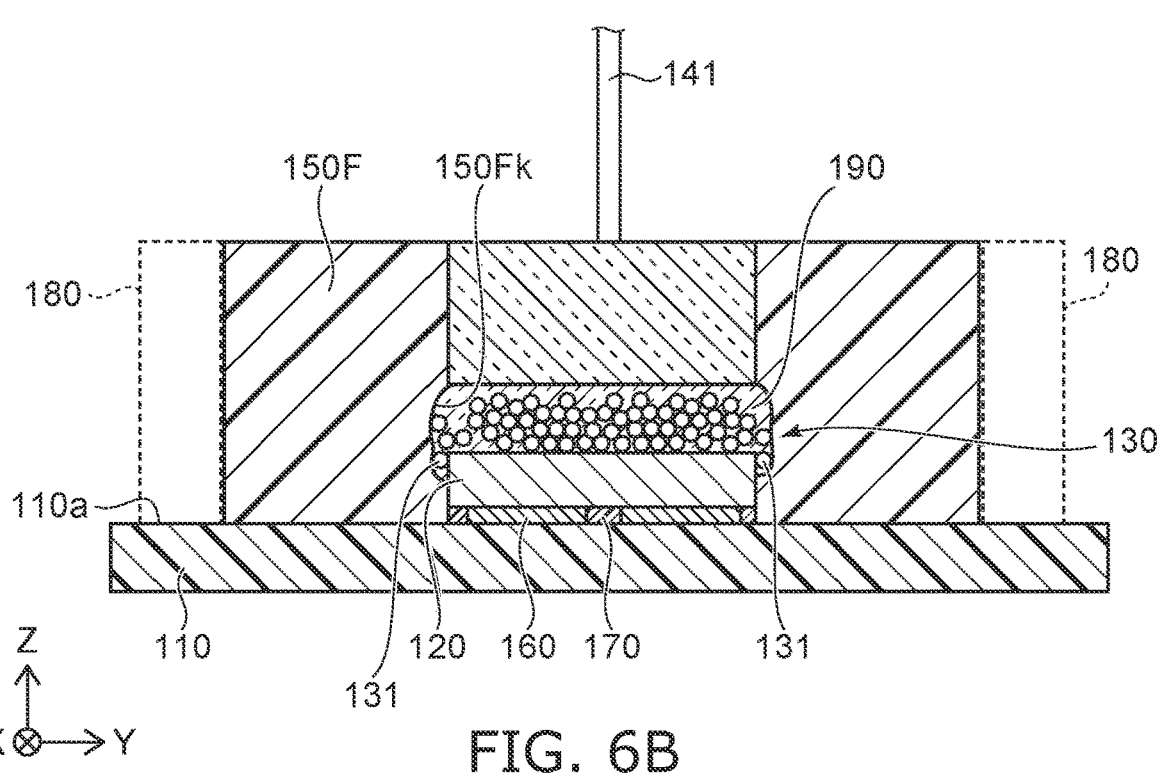
FIG. 6B is a schematic diagram illustrating the method of manufacturing the light-emitting device according to the reference example.

FIGS. 6A and 6B are schematic diagrams illustrating the method of manufacturing a light-emitting device according to a reference example.

As illustrated in FIG. 6A, in the method of manufacturing a light-emitting device according to the reference example, the light-transmissive plate 140 is disposed on the wavelength conversion layer 130 with an adhesive 190 disposed on the wavelength conversion layer 130. In this manner, the light-transmissive plate 140 is adhered to the wavelength conversion layer 130 by the adhesive 190. However, by pressing the light-transmissive plate 140 against the wavelength conversion layer 130 in order to adhere the light-transmissive plate 140 to the wavelength conversion layer 130, the adhesive 190 may be squashed, and the plurality of wavelength conversion particles 131 may spew out from between the light-transmissive plate 140 and the light-emitting element 120 together with the adhesive 190.

Thus, in a case in which the light-reflective material 150F is provided, as illustrated in FIG. 6B, a recess 150Fk is formed in the inner surface 150Fb of the light-reflective material 150F by the portion where the plurality of wavelength conversion particles 131 spewed out from between the light-transmissive plate 140 and the light-emitting element 120 together with the adhesive 190. The recess 150Fk remains even after the light-reflective material 150F is cured. In this manner, in a case in which the adhesive 190 is provided, a portion of the plurality of wavelength conversion particles 131 disposed on the light-emitting element 120 moves to a position outside the region immediately above the light-emitting element 120. Thus, the number of wavelength conversion particles 131 disposed on the light-emitting element 120 is reduced, and the light extraction efficiency is reduced. In addition, when the recess 150Fk is provided in the wall, the second light L2 emitted from the wavelength conversion particles 131 located in the recess 150Fk propagates into the wall, and the propagated second light L2 may exit from the upper surface of the wall.

In contrast, in the present embodiment, the adhesive 190 is not disposed between the light-transmissive plate 140 and the wavelength conversion layer 130 during manufacturing. Thus, by disposing the light-transmissive plate 140, a portion of the plurality of wavelength conversion particles 131 disposed on the light-emitting element 120 can be suppressed from moving to a position outside the region immediately above the light-emitting element 120. Thus, the light extraction efficiency can be improved. In this manner, because the adhesive 190 is not disposed between the light-transmissive plate 140 and the wavelength conversion layer 130 during manufacture, in the formed light-emitting device 100, the air layer 130k is interposed between the wavelength conversion layer 130 and the light-transmissive plate 140.

Next, an effect of the present embodiment will be described. In the light-emitting device 100 according to the present embodiment, the wall 150 surrounds the wavelength conversion layer 130 and the light-transmissive plate 140. Accordingly, the upper surface 150a of the wall 150 is provided at a higher position than the upper surface 130a of the wavelength conversion layer 130. Therefore, a light-emitting device 100 in which light can be inhibited from leaking from the upper surface 150a of the wall 150 can be provided. Also with this configuration, the contrast between the peripheral region S2 and the region S1 directly above the light-emitting element 120 and the wavelength conversion layer 130 can be increased.

Also, in the present embodiment, the upper portion of the wavelength conversion layer 130 has protrusions and recesses due to the wavelength conversion particles 131, and the air layer 130k is interposed between the wavelength conversion layer 130 and the light-transmissive plate 140. Thus, the probability that the first light L1 and the second light L2 are reflected is high at the interface between the protrusions and recesses resulting from the wavelength conversion particles 131 of the upper portion of the wavelength conversion layer 130 and the air layer 130k. Thus, propagation of the first light L1 and the second light L2 in the lateral direction is blocked in the wavelength conversion layer 130, and the light is emitted from the region directly above the light-emitting element 120 and the wavelength conversion layer 130. Thus, the contrast between the peripheral region S2 and the region S1 directly above the light-emitting element 120 and the wavelength conversion layer 130 can be increased. Also, the adhesive 190 is not provided between the wavelength conversion layer 130 and the light-transmissive plate 140. Thus, when the light-transmissive plate 140 is disposed on the wavelength conversion layer 130 during manufacturing, it is possible to suppress the wavelength conversion particles 131 from spewing out from between the light-transmissive plate 140 and the light-emitting element 120. As a result, the light extraction efficiency can be improved. Because the air layer 130k is provided between the wavelength conversion layer 130 and the light-transmissive plate 140, the upper surface and/or the lower surface of the light-transmissive plate 140 can be processed to form a protruding shape, a recessed shape, a shape with protrusions and recesses, and the like. Because there are two surfaces, the upper surface and the lower surface, that can be surface processed, optical control can be easily performed.

The lateral surface 140c of the light-transmissive plate 140 is perpendicular to the upper surface 110a of the substrate 110. Thus, the contrast between the peripheral region S2 and the region S1 directly above the light-emitting element 120 and the wavelength conversion layer 130 can be further increased.

The upper surface 150a of the wall 150 is parallel to the upper surface 110a of the substrate 110. Therefore, the thickness t of the corner portion c can be increased further than in a case in which the upper surface 150a of the wall 150 is recessed in the direction approaching the upper surface 110a of the substrate 110. Thus, light can be inhibited from leaking from the upper surface 150a of the wall 150.

The wavelength conversion layer 130 includes the glass layer 132 that covers the surface of the wavelength conversion particles 131. The wavelength conversion particles 131 are bonded to each other via the glass layer 132, and the air layer 130k is formed between the wavelength conversion particles 131. Thus, the contrast between the peripheral region S2 and the region S1 directly above the light-emitting element 120 and the wavelength conversion layer 130 can be further increased.

In the method of manufacturing the light-emitting device 100 according to the present embodiment, first, the light-emitting element 120 that emits the first light is mounted on the substrate. Subsequently, the wavelength conversion layer 130 including the plurality of wavelength conversion particles 131 that convert a part of the first light L1 and emit the second light L2 is disposed on the light-emitting element 120 such that an upper portion of the wavelength conversion layer 130 includes protrusions and recesses due to the wavelength conversion particles 131. Subsequently, the light-transmissive plate 140 is disposed above the wavelength conversion layer 130 so as to include the air layer 130$k$ between the wavelength conversion layer 130. Subsequently, the uncured light-reflective material 150F is provided surrounding the wavelength conversion layer 130 and the light-transmissive plate 140. Subsequently, the light-reflective material 150F is cured to form the wall 150. In this manner, the light-emitting device 100 in which light can be inhibited from leaking from the upper surface 150$a$ of the wall 150 and that has improved light extraction efficiency can be provided.

Also, in the method of manufacturing the light-emitting device 100 according to the present embodiment, when providing the light-reflective material 150F, the light-reflective material 150F is provided such that the upper end of the inner surface 150Fb is located at the same position in the vertical direction as the upper end of the lateral surface 140$c$ of the light-transmissive plate 140. Thus, the angle $\theta$ of a corner portion c between the upper surface 150$a$ and the inner surface 150$b$ of the cured light-reflective material 150F (wall 150) is 90 degrees or more.

Second Embodiment

Next, a second embodiment will be described.

Figure 7:
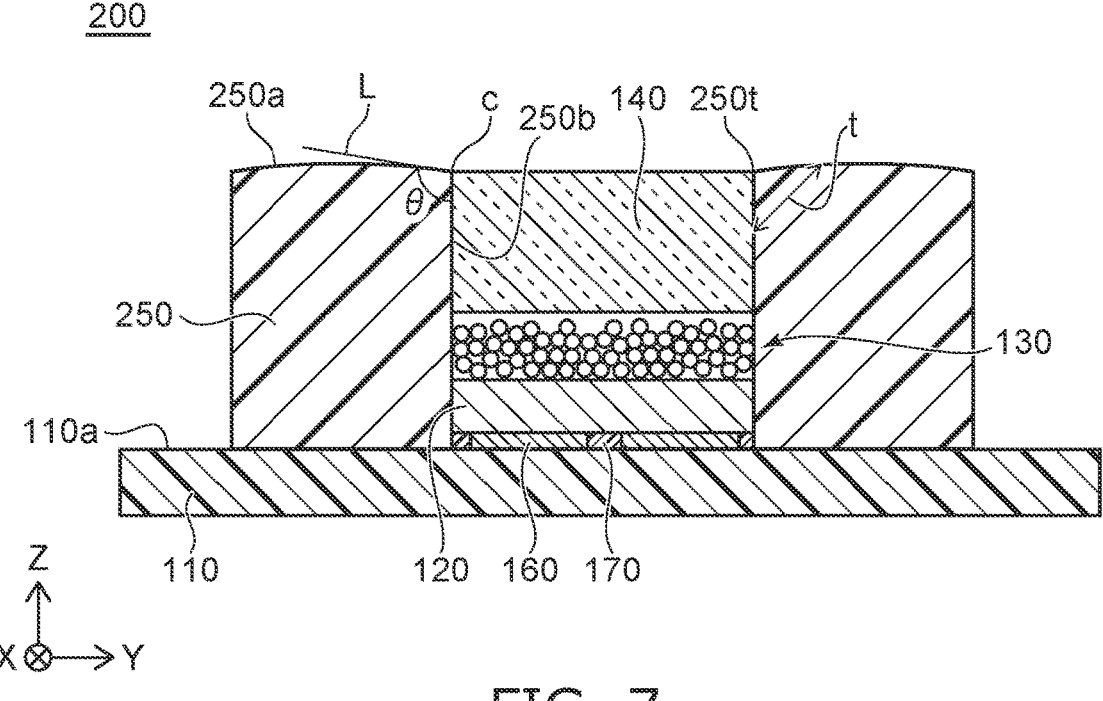
FIG. 7 is a schematic end view illustrating a light-emitting device according to a second embodiment.

FIG. 7 is a schematic end view illustrating a light-emitting device according to the present embodiment.

A light-emitting device 200 according to the present embodiment differs from the light-emitting device 100 according to the first embodiment in that an upper surface 250$a$ of a wall 250 is not parallel to the upper surface 110$a$ of the substrate 110. In the following description, in general, only differences from the first embodiment will be described. The second embodiment is similar to the first embodiment, except for the points described below.

The configuration of the wall 250 is similar to the configuration of the wall 150 in the first embodiment, except for the shape of the upper surface 250$a$. The upper surface 250$a$ of the wall 250 is a curved surface that protrudes toward the direction away from the substrate 110. In this case, the angle $\theta$ of the corner portion c between the upper surface 250$a$ and an inner surface 250$b$ of the wall 250 is in a range of 90 degrees or more and less than 180 degrees. Here, the angle $\theta$ is an angle formed by the inner surface 250$b$ and a tangent line L of the upper surface 250$a$ passing through an upper end 250$t$ of the inner surface 250$b$. Thus, the angle $\theta$ can be greater than 90 degrees. In this case, the thickness t of the corner portion c can be further increased. Thus, even if the second light L2 propagates into the wall 250 from a region of the inner surface 250$b$ of the wall 250 near the corner portion c, the propagated second light L2 is attenuated, and the second light L2 can be inhibited from leaking from the upper surface 250$a$.

Next, a method of manufacturing the light-emitting device 200 according to the present embodiment will be described.

Figure 8:
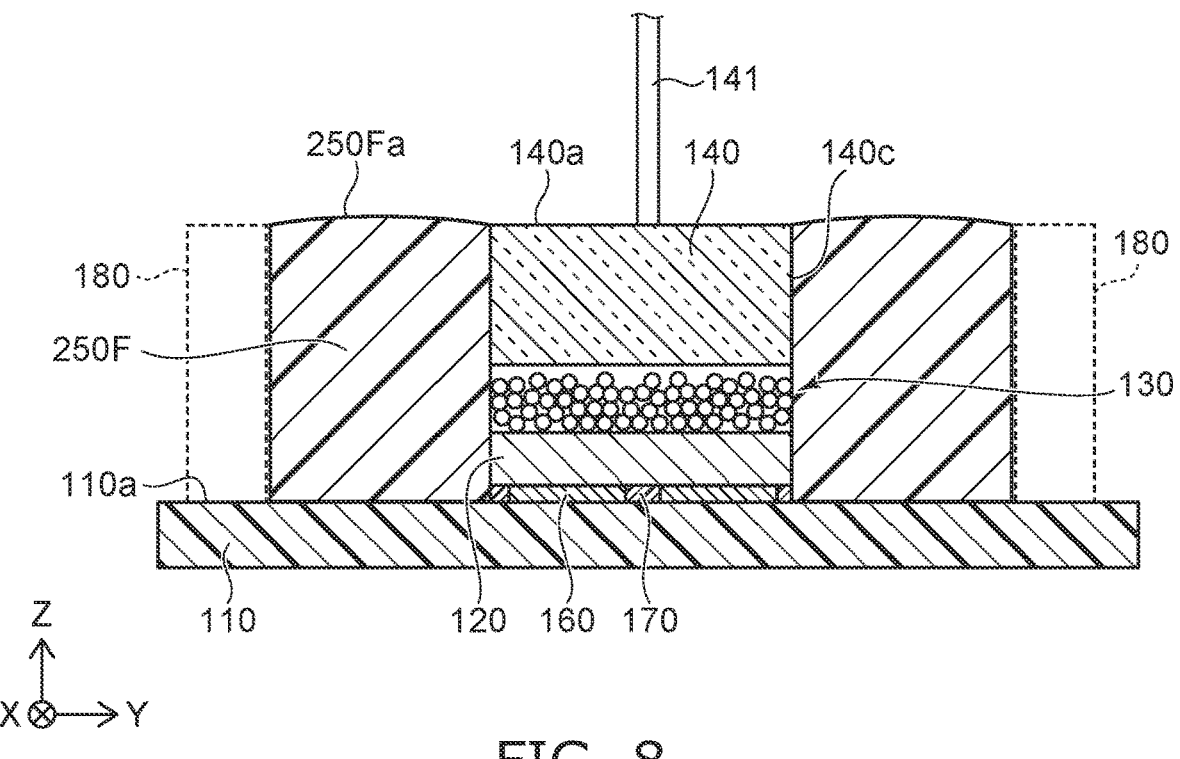
FIG. 8 is a schematic diagram illustrating a method of manufacturing the light-emitting device according to the second embodiment.

FIG. 8 is a schematic diagram illustrating the method of manufacturing the light-emitting device according to the present embodiment.

The method of manufacturing the light-emitting device 200 according to the present embodiment is different from the method of manufacturing the light-emitting device 100 according to the first embodiment in terms of a step of providing a light-reflective material 250F.

After the light-transmissive plate 140 illustrated in FIG. 5C is disposed, the uncured light-reflective material 250F is disposed such that the upper surface 250$a$ having been subjected to curing protrudes in the direction away from the upper surface 110$a$ of the substrate 110, as illustrated in FIG. 8. As with the light-reflective material 150F in the first embodiment, the uncured light-reflective material 250F includes a base material formed of an uncured resin material, and a filler formed of a light-reflective material. Specifically, the uncured light-reflective material 250F is provided such that an upper surface 250Fa of the uncured light-reflective material 250F protrudes in the direction away from the upper surface 110$a$ of the substrate 110 due to surface tension. Thus, the upper surface 250$a$ of the cured light-reflective material 250F protrudes in the direction away from the upper surface 110$a$ of the substrate 110. The subsequent procedure is similar to the first embodiment.

Next, an effect of the present embodiment will be described.

In the present embodiment, the upper surface 250$a$ of the wall 250 protrudes toward the direction away from the substrate 110. Thus, the thickness t of the corner portion c can be further increased. As a result, even if the second light L2 propagates into the wall 250 from a region of the inner surface 250$b$ of the wall 250 near the corner portion c, the propagated second light L2 is attenuated, and the second light L2 can be inhibited from leaking from the upper surface 250$a$.

Third Embodiment

Next, a third embodiment will be described.

Figure 9:
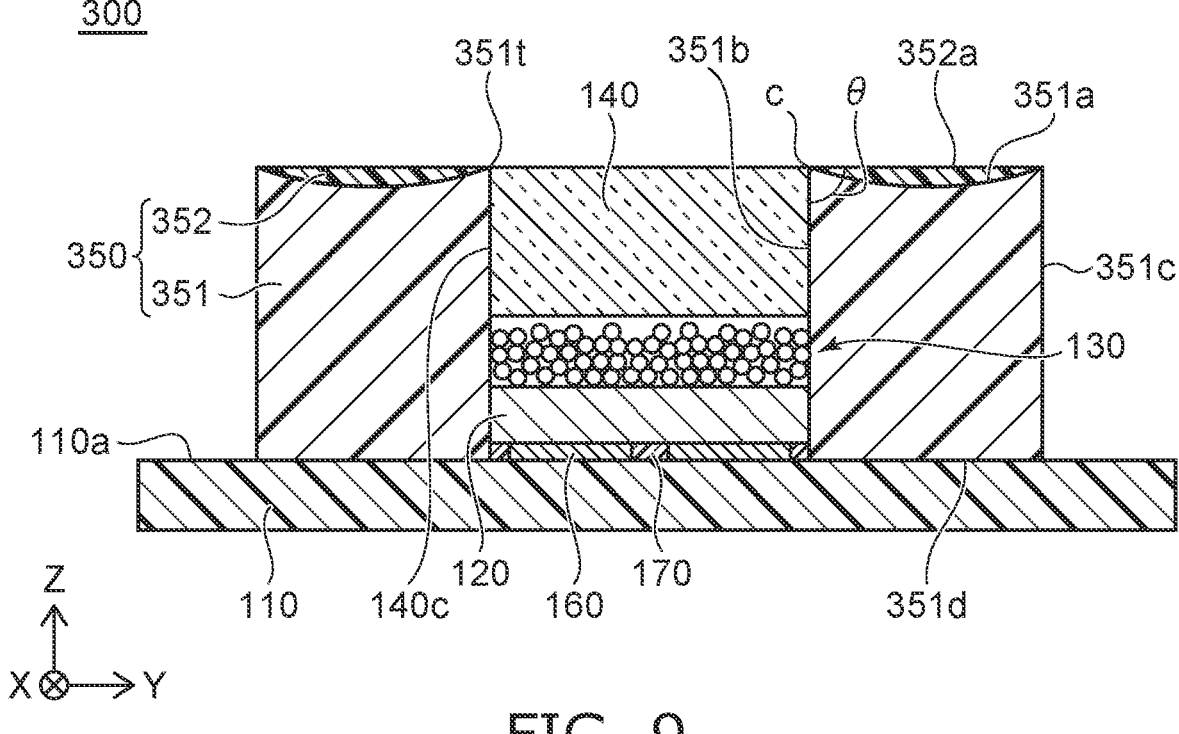
FIG. 9 is a schematic end view illustrating a light-emitting device according to a third embodiment.

FIG. 9 is a schematic end view illustrating a light-emitting device 400 according to the present embodiment.

A light-emitting device 300 according to the present embodiment differs from the light-emitting device 100 according to the first embodiment in terms of the configuration of a wall 350.

The wall 350 includes a body portion 351 and a filler portion 352.

The body portion 351 includes a base material formed of a resin material and a filler formed of a light-reflective material. A thermosetting resin such as a silicone resin or an epoxy resin can be used as the resin material. Silicon oxide ($SiO_2$), titanium oxide ($TiO_2$), aluminum (Al), silver (Ag), or other light-reflective material can be used as the filler. The body portion 351 surrounds the light-emitting element 120, the wavelength conversion layer 130, and the light-transmissive plate 140.

The surface of the body portion 351 includes an upper surface 351$a$, an inner surface 351$b$, an outer surface 351$c$, and a lower surface 351$d$.

The upper surface 351$a$ is a curved surface recessed in a direction toward the upper surface 110$a$ of the substrate 110. In the present embodiment, the inner surface 351$b$ surrounds the light-emitting element 120, the wavelength conversion layer 130, and the light-transmissive plate 140. The inner surface 351$b$ is in contact with a lateral surface of the light-emitting element 120, a lateral end portion of the wavelength conversion layer 130, and the lateral surface 140$c$ of the light-transmissive plate 140. The region in the inner surface 351$b$ including at least an upper end 351$t$ located highest up is in contact with the lateral surface 140$c$ of the light-transmissive plate 140 and thus is perpendicular to the upper surface 110$a$ of the substrate 110.

The outer surface 351$c$ surrounds the upper surface 351$a$. The outer surface 351$c$ is perpendicular to the upper surface 110$a$ of the substrate 110. However, the shape of the outer surface 351$c$ is not particularly limited. For example, the outer surface 351$c$ may be inclined with respect to the Z axis.

The lower surface 351d is located opposite the upper surface 351a. In the present embodiment, the lower surface 351d is in contact with the upper surface 110a of the substrate 110.

The filler portion 352 fills the recess in the upper surface 351a of the body portion 351. The filler portion 352 includes a base material formed of a resin material, and a filler dispersed in the base material. A thermosetting resin such as a silicone resin or an epoxy resin can be used as the resin material. A light-reflective material such as silicon oxide (SiO₂), titanium oxide (TiO₂), aluminum (Al), and silver (Ag), or a light absorbing material such as carbon particles formed of carbon powder can be used as the filler.

An upper surface 352a of the filler portion 352 is parallel to the upper surface 110a of the substrate 110. However, the filler portion 352 can protrude in the direction away from the substrate 110. Thus, with such a configuration, the angle θ of the corner portion c between the upper surface 352a and the inner surface 351b of the wall 350 can be in a range of 90 degrees or more and less than 180 degrees.

If the filler in the filler portion 352 is formed of a light-reflective material, the density of the filler included in the filler portion 352 is preferably higher than the density of the filler included in the body portion 351. With this configuration, the second light L2 that has propagated into the wall 350 can be further inhibited from leaking from the upper surface 352a.

If the filler in the filler portion 352 is formed of a light absorbing material, the filler in the filler portion 352 can absorb the second light L2 that has propagated into the wall 350. With this configuration, the second light L2 that has propagated into the wall 350 can be further inhibited from leaking from the upper surface 352a.

Fourth Embodiment

Next, a fourth embodiment will be described.

Figure 10:
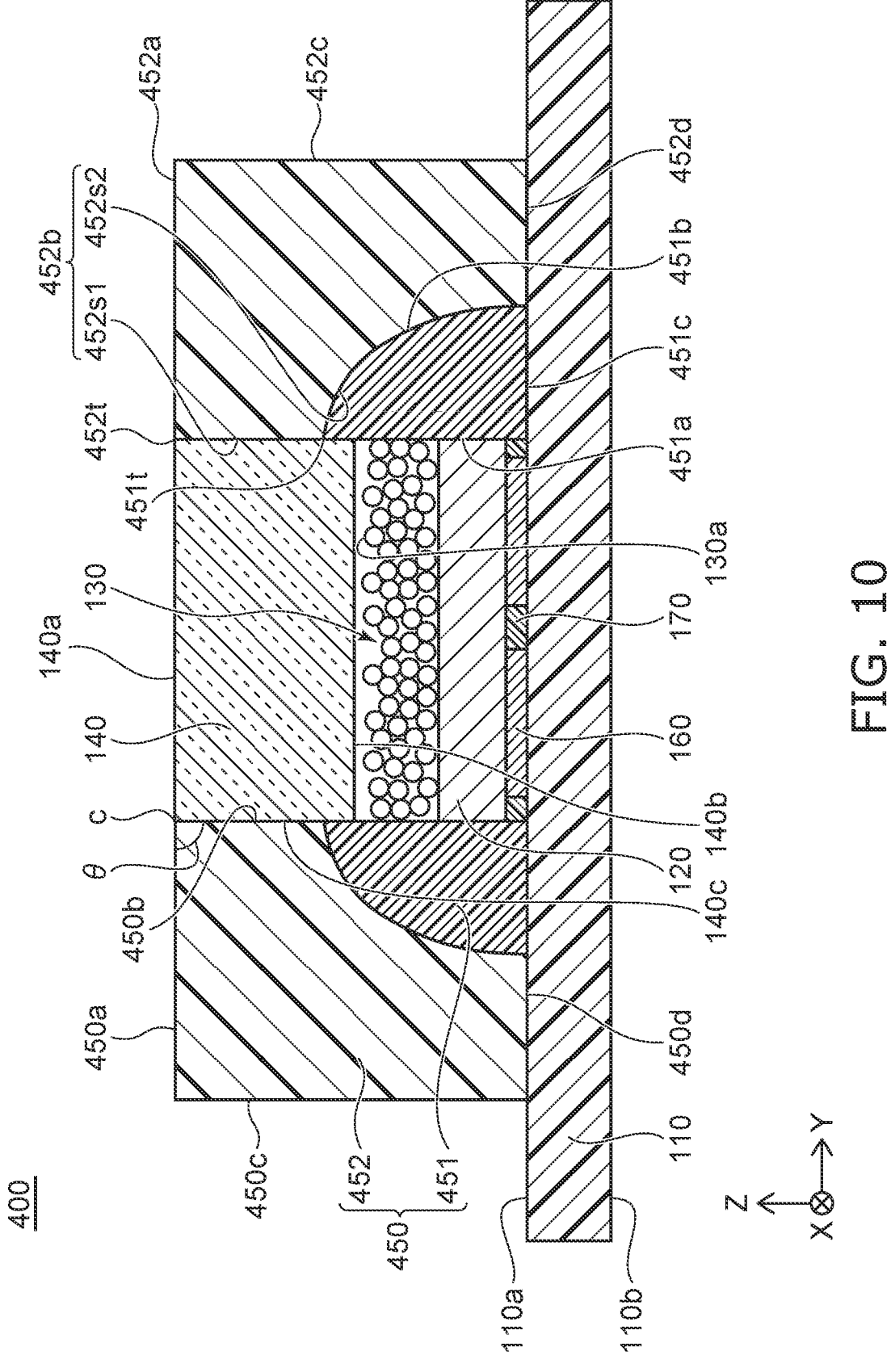
FIG. 10 is a schematic end view illustrating a light-emitting device according to a fourth embodiment.

FIG. 10 is a schematic end view illustrating a light-emitting device according to the present embodiment.

A light-emitting device 400 according to the present embodiment differs from the light-emitting device 100 according to the first embodiment in terms of the configuration of a wall 450.

The wavelength conversion layer 130 is surrounded by the wall 450. The wall 450 has a tubular shape. The wall 450 includes a first portion 451 and a second portion 452. Each of the first portion 451 and the second portion 452 includes a base material formed of a resin material, and a plurality of fillers formed of a light-reflective material. A thermosetting resin such as a silicone resin or an epoxy resin can be used as the resin material of the wall 450. Silicon oxide (SiO₂), titanium oxide (TiO₂), aluminum (Al), silver (Ag), or the like can be used as the light-reflective material of the wall 450.

The density of the filler in the first portion 451 and the density of the filler in the second portion 452 are different from each other. The "density of the filler" refers to the mass of the filler contained in the unit volume of each of the first and second portions 451 and 452.

In the present embodiment, the first portion 451 surrounds both the light-emitting element 120 and the wavelength conversion layer 130. The surface of the first portion 451 includes an inner surface 451a, an outer surface 451b, and a lower surface 451c.

The inner surface 451a surrounds the light-emitting element 120, the wavelength conversion layer 130, and the lower region of the lateral surface 140c of the light-transmissive plate 140, and is in contact with a lateral surface of the light-emitting element 120, an end portion of the wavelength conversion layer 130 in the lateral direction, and the lower region of the lateral surface 140c of the light-transmissive plate 140. An upper end 451t located at the uppermost position in the inner surface 451a is located between the upper surface 130a of the wavelength conversion layer 130 and the upper surface 140a of the light-transmissive plate 140.

The outer surface 451b surrounds the inner surface 451a and is in contact with the inner surface 451a and the lower surface 451c. The outer surface 451b is further separated from the inner surface 451a further along the downward direction. However, the upper surface can be located between the inner surface 451a and the outer surface 451b. In this case, the outer surface 451b can be perpendicular to the upper surface 110a of the substrate 110. The lower surface 451c is in contact with the upper surface 110a of the substrate 110.

The second portion 452 is provided on the first portion 451 and surrounds the first portion 451. The density of the filler contained in the first portion 451 is higher than the density of the filler contained in the second portion 452. Thus, the light reflectance of the first portion 451 is higher than the light reflectance of the second portion 452.

The surface of the second portion 452 includes an upper surface 452a, an inner surface 452b, an outer surface 452c, and a lower surface 452d. In the present embodiment, the upper surface 452a is a flat surface parallel to the upper surface 110a of the substrate 110. The upper surface 452a is flush with the upper surface 140a of the light-transmissive plate 140. However, the upper surface 452a can protrude in the direction away from the substrate 110.

The inner surface 452b includes a first region 452s1 located between the upper surface 452a and the upper end 451t and a second region 452s2 located between the upper end 451t and the lower surface 452d. The first region 452s1 surrounds the light-transmissive plate 140. The first region 452s1 is in contact with the lateral surface 140c of the light-transmissive plate 140 and thus is perpendicular to the upper surface 110a of the substrate 110. The second region 452s2 is in contact with the outer surface 451b of the first portion 451.

The outer surface 452c surrounds the upper surface 452a and is in contact with the upper surface 452a and the lower surface 452d. The outer surface 452c is perpendicular to the upper surface 110a of the substrate 110. However, the outer surface 452c may be inclined with respect to the Z axis. The lower surface 452d is in contact with the upper surface 110a of the substrate 110.

Thus, an upper surface 450a of the entire wall 450 includes the upper surface 452a of the second portion 452. The inner surface 450b of the entire wall 450 includes the inner surface 451a of the first portion 451 and the first region 452s1 of the second portion 452. An outer surface 450c of the entire wall 450 includes the outer surface 452c of the second portion 452. A lower surface 450d of the entire wall 450 includes the lower surface 451c of the first portion 451 and the lower surface 452d of the second portion 452.

In the present embodiment, the upper surface 450a is parallel to the upper surface 110a of the substrate 110, and a region (the first region 452s1) of the inner surface 450b that includes an upper end 452t is perpendicular to the upper surface 110a of the substrate 110. Thus, the angle θ of a corner portion c between the upper surface 450a and the inner surface 450b is 90 degrees. However, the upper surface 450a may be a curved surface protruding in the direction away from the substrate 110. That is, the angle θ may be greater than 90 degrees and less than 180 degrees.

Next, operation of the light-emitting device 400 according to the present embodiment will be described. On the inner surface 450b of the wall 450, the luminance of the incident second light L2 is higher closer to a region adjacent to the wavelength conversion layer 130. Thus, the second light L2 easily propagates in a portion of the wall 450 adjacent to the wavelength conversion layer 130. In the present embodiment, the reflectance of the first portion 451 adjacent to the wavelength conversion layer 130 is higher than the reflectance of the second portion 452. Thus, the second light L2 can be inhibited from propagating into the first portion 451 adjacent to the wavelength conversion layer 130.

Next, a method of manufacturing the light-emitting device 400 according to the present embodiment will be described.

Figure 11A:
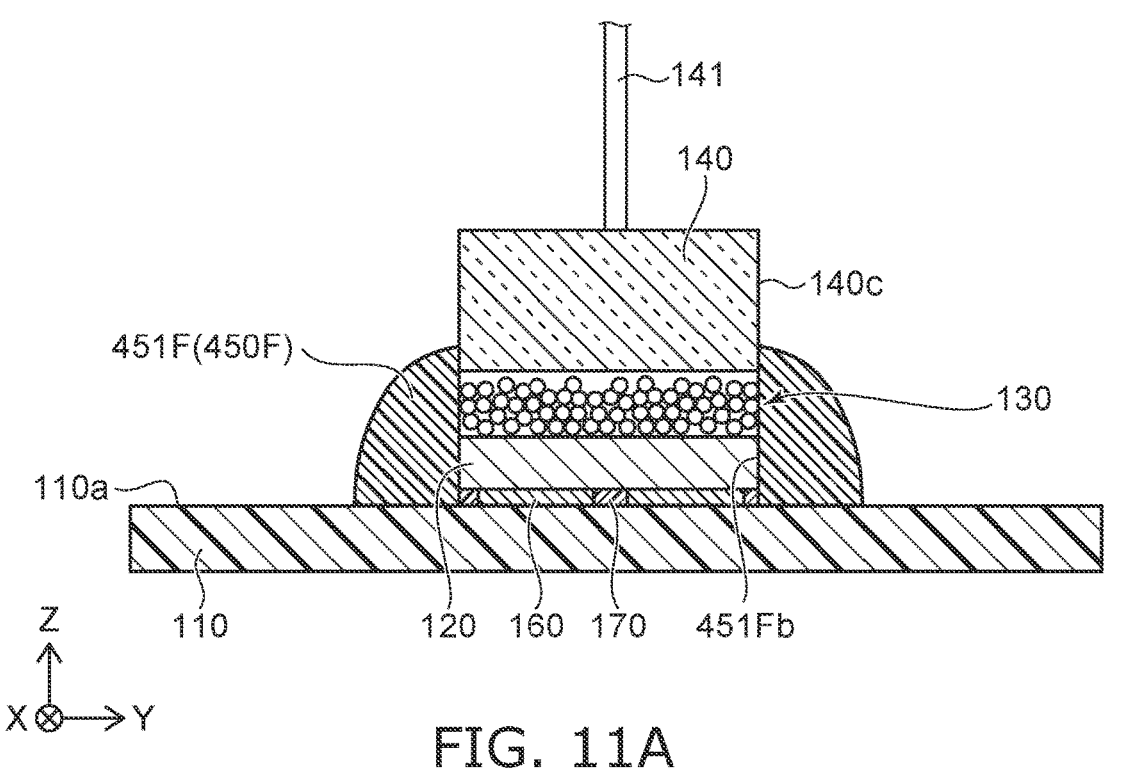
FIG. 11A is a schematic diagram illustrating a method of manufacturing the light-emitting device according to the fourth embodiment.
Figure 11B:
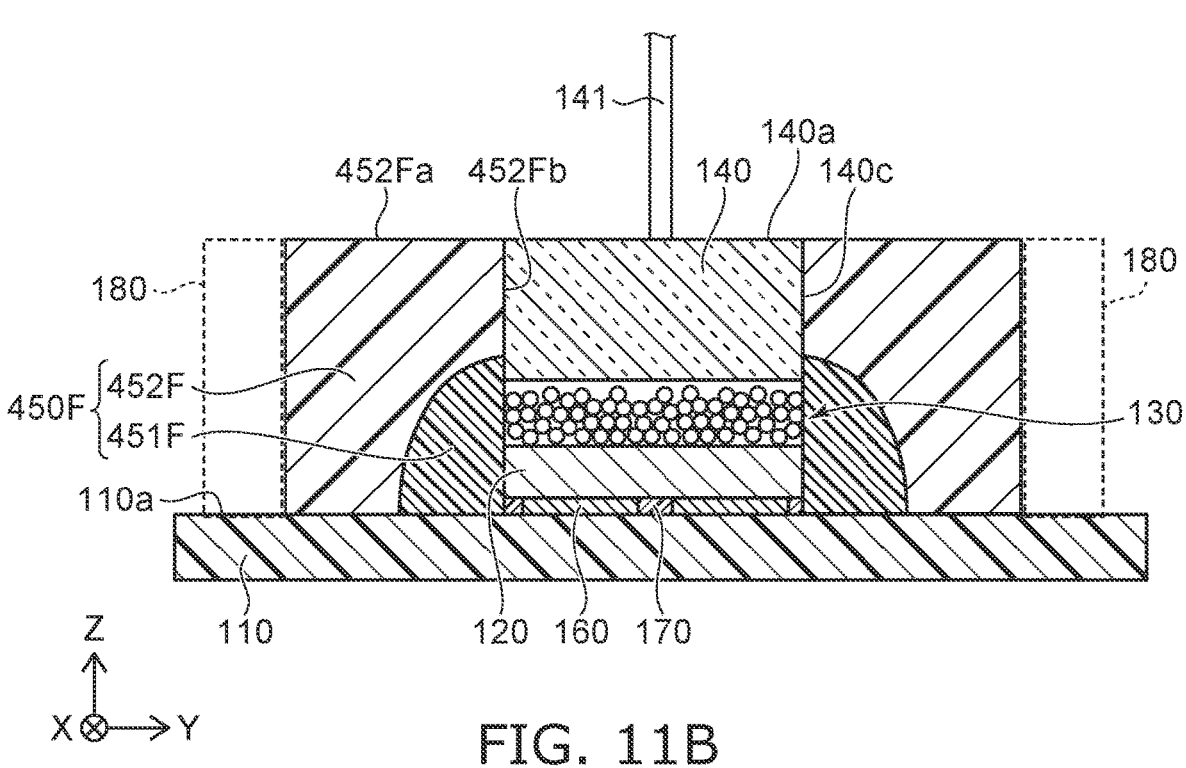
FIG. 11B is a schematic diagram illustrating a method of manufacturing the light-emitting device according to the fourth embodiment.

FIGS. 11A and 11B are schematic diagrams illustrating the method of manufacturing the light-emitting device according to the present embodiment.

Firstly, as illustrated in FIG. 5C, after the light-transmissive plate 140 is disposed above the wavelength conversion layer 130, as illustrated in FIGS. 11A and 11B, an uncured light-reflective material 450F is provided surrounding the wavelength conversion layer 130 and the light-transmissive plate 140.

The uncured light-reflective material 450F includes a first member 451F and the second member 452F. Each of the first member 451F and the second member 452F includes a base material formed of an uncured resin material, and a filler formed of a light-reflective material. The first member 451F and the second member 452F are different in terms of the concentration of the filler. Note that when the first member 451F is cured, the first member 451F forms the first portion 451 of the wall 450. When the second member 452F is cured, the second member 452F forms the second portion 452 of the wall 450.

First, as illustrated in FIG. 11A, the first member 451F is provided surrounding the wavelength conversion layer 130 and the lower region of the lateral surface 140c of the light-transmissive plate 140 and in contact with the lower region of the lateral surface 140c of the light-transmissive plate 140. The uncured first member 451F preferably has a viscosity such that after being provided surrounding the wavelength conversion layer 130 and the light-transmissive plate 140, the first member 451F does not flow into the wavelength conversion layer 130. For example, the viscosity of the uncured first member 451F is preferably in a range from 450 Pa s to 1000 Pa s. This makes it possible to inhibit the first member 451F from flowing into the wavelength conversion layer 130 while bringing an inner surface 451Fb of the uncured first member 451F into contact with the lower region of the lateral surface 140c of the light-transmissive plate 140.

Subsequently, the first member 451F is semi-cured. Note that the first member 451F need not necessarily be semi-cured.

Subsequently, as illustrated in FIG. 11B, the second member 452F is provided on the first member 451F surrounding the first member 451F. The viscosity of the uncured second member 452F is lower than the viscosity of the uncured first member 451F. A method of decreasing the viscosity of the second member 452F further than the viscosity of the first member 451F is not particularly limited. Examples of the method include a method of decreasing the concentration of a filler contained in the second member 452F further than the concentration of a filler contained in the first member 451F, and a method of decreasing the amount of a thickening agent added to the second member 452F further than the amount of a thickening agent added to the first member 451F.

The uncured second member 452F preferably has a viscosity such that the second member 452F can flow along the shape of the lateral surface 140c of the light-transmissive plate 140. For example, the viscosity of the second member 452F is preferably in a range from 5 Pa s to 250 Pa s. When disposing the second member 452F, the frame member 180 that surrounds the light-transmissive plate 140 and the first member 451F can be provided at a position separated from the light-transmissive plate 140 and the first member 451F, and the second member 452F can be disposed between the light-transmissive plate 140 and the frame member 180.

In the present embodiment, the second member 452F is disposed such that the upper surface 450a having been subjected to curing is parallel to the upper surface 110a of the substrate 110. Specifically, the uncured second member 452F is provided such that the upper end of an inner surface 452Fb of the uncured second member 452F is located at the same position in the vertical direction as the upper end of the lateral surface 140c of the light-transmissive plate 140.

As described above, the first member 451F is in contact with the lower region of the lateral surface 140c of the light-transmissive plate 140 and surrounds the wavelength conversion layer 130. Thus, the second member 452F can be made to flow along the shape of the lateral surface 140c of the light-transmissive plate 140 while inhibiting the second member 452F from flowing into the wavelength conversion layer 130 with the first member 451F.

Subsequently, the light-reflective material 450F (the first member 451F and the second member 452F) is cured. Subsequently, the holding tool 141 and the frame member 180 are removed from the substrate 110. Thus, the light-emitting device 400 in which the first portion 451 and the second portion 452 are provided in the wall 450 is formed.

Next, an effect of the present embodiment will be described. In the light-emitting device 400 according to the present embodiment, the wall 450 includes a base material formed of a resin material, and a filler that is dispersed in the base material and formed of a light-reflective material. The wall 450 includes the first portion 451 surrounding the wavelength conversion layer 130, and the second portion 452 provided on the first portion 451 and surrounding the first portion 451. The density of the filler contained in the first portion 451 is higher than the density of the filler contained in the second portion 452. Thus, the reflectance of the first portion 451 can be set higher than the reflectance of the second portion 452. As a result, the second light L2 can be inhibited from propagating into the first portion 451 adjacent to the wavelength conversion layer 130.

Also, in the method of manufacturing the light-emitting device 400 according to the present embodiment, the light-reflective material 450F includes the first member 451F provided surrounding the wavelength conversion layer 130, and the second member 452F provided on the first member 451F and surrounding the first member 451F. The viscosity of the first member 451F is higher than the viscosity of the second member 452F. Thus, the second member 452F can be made to easily flow along the shape of the lateral surface 140c of the light-transmissive plate 140 while inhibiting the second member 452F from flowing into the wavelength conversion layer 130 with the first member 451F.

Fifth Embodiment

Next, a fifth embodiment will be described.

Figure 12:
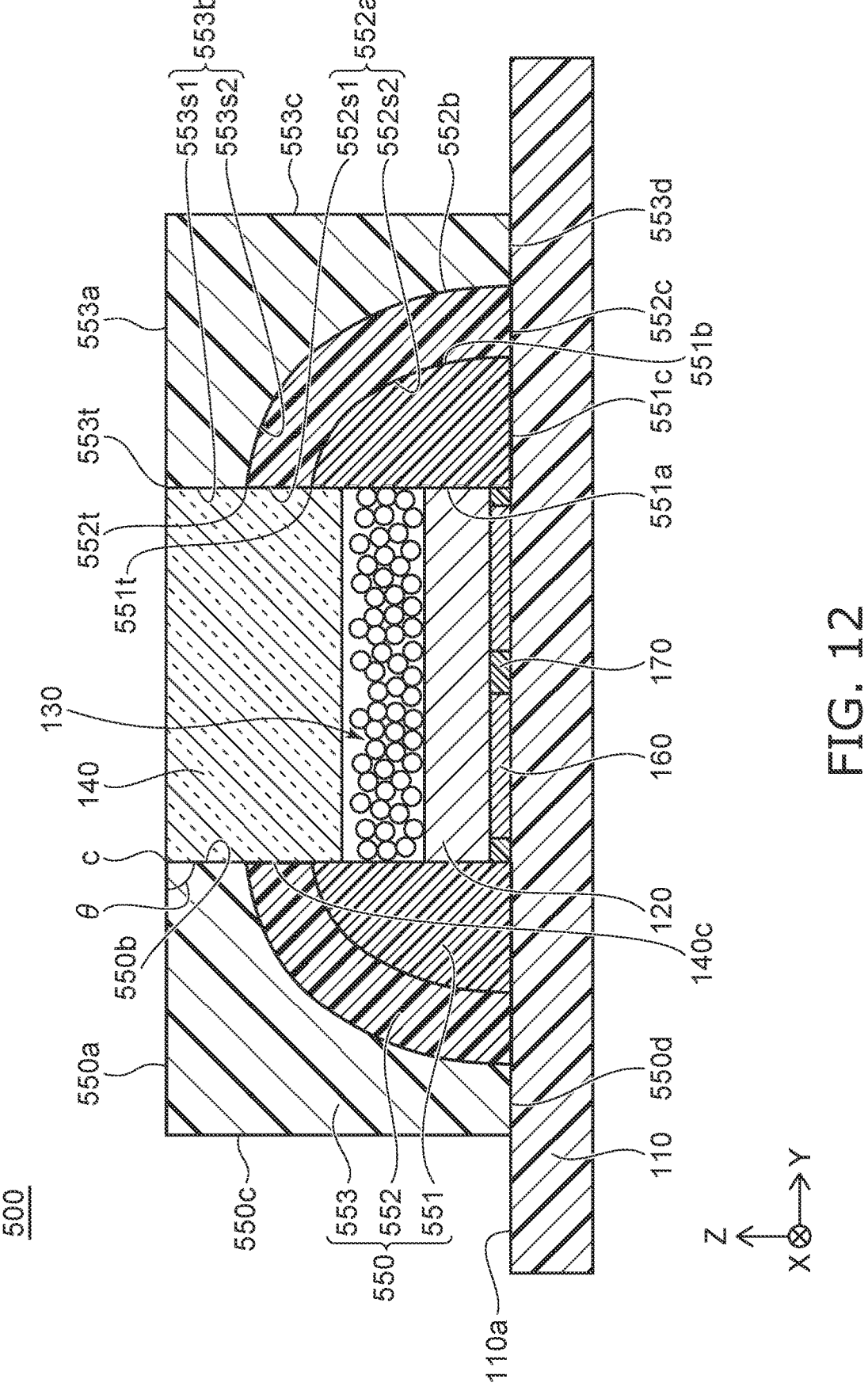
FIG. 12 is a schematic end view illustrating a light-emitting device according to a fifth embodiment.

FIG. 12 is a schematic end view illustrating a light-emitting device according to the present embodiment.

A light-emitting device 500 according to the present embodiment differs from the light-emitting device 400 according to the fourth embodiment in terms of the configuration of a wall 550. Note that, in the following description, in general, only differences from the fourth embodiment will be described. The fifth embodiment is similar to the fourth embodiment, except for the points described below.

The wall 550 includes a first portion 551, a second portion 552, and a third portion 553. The first portion 551 surrounds both the light-emitting element 120 and the wavelength conversion layer 130. The second portion 552 is provided on the first portion 551 and surrounds the first portion 551. The third portion 553 is provided on the second portion 552 and surrounds the second portion 552.

Each of the first portion 551, the second portion 552, and the third portion 553 includes a base material formed of a resin material, and a filler formed of a light-reflective material. The density of the filler contained in the first portion 551 is higher than the density of the filler contained in the second portion 552. The density of the filler contained in the second portion 552 is higher than the density of the filler contained in the third portion 553. Thus, the light reflectance of the first portion 551 is higher than the light reflectance of the second portion 552, and the light reflectance of the second portion 552 is higher than the light reflectance of the third portion 553.

The surface of the first portion 551 includes an inner surface 551a, an outer surface 551b, and a lower surface 551c. The inner surface 551a surrounds the light-emitting element 120, the wavelength conversion layer 130, and the lower region of the lateral surface 140c of the light-transmissive plate 140, and is in contact with a lateral surface of the light-emitting element 120, an end portion of the wavelength conversion layer 130 in the lateral direction, and the lower region of the lateral surface 140c of the light-transmissive plate 140. An upper end 551t located at the uppermost position in the inner surface 551a is located between the upper surface 130a of the wavelength conversion layer 130 and the upper surface 140a of the light-transmissive plate 140.

The outer surface 551b surrounds the inner surface 551a and is in contact with the inner surface 551a and the lower surface 551c. The outer surface 551b is further separated from the inner surface 551a further along the downward direction. However, the upper surface can be located between the inner surface 551a and the outer surface 551b. In this case, the outer surface 551b can be perpendicular to the upper surface 110a of the substrate 110. The lower surface 551c is in contact with the upper surface 110a of the substrate 110.

The surface of the second portion 552 includes an inner surface 552a, an outer surface 552b, and a lower surface 552c.

The inner surface 552a surrounds the light-transmissive plate 140 and the first portion 551. An upper end 552t located at the uppermost position in the inner surface 552a is located above the upper end 551t of the first portion 551. The inner surface 552a includes a first region 552s1 located between the upper end 552t and the upper end 551t of the first portion 551 and a second region 552s2 located between the upper end 551t and the lower surface 552c. The first region 552s1 is in contact with a lateral surface 140c of the light-transmissive plate 140. The second region 552s2 is in contact with the outer surface 551b of the first portion 551.

The outer surface 552b surrounds the inner surface 552a and is in contact with the inner surface 552a and the lower surface 552c. The upper surface can be located between the inner surface 552a and the outer surface 552b. The lower surface 552c is in contact with the upper surface 110a of the substrate 110.

The third portion 553 is provided on the second portion 552 and surrounds the second portion 552. The surface of the third portion 553 includes an upper surface 553a, an inner surface 553b, an outer surface 553c, and a lower surface 553d. The upper surface 553a is parallel to the upper surface 110a of the substrate 110. However, the upper surface 553a can protrude in the direction away from the substrate 110.

An upper end 553t located at the uppermost position in the inner surface 553b is located above the upper end 552t of the second portion 552. The inner surface 553b includes a third region 553s1 located between the upper end 553t and the upper end 552t and a fourth region 553s2 located between the upper end 552t and the lower surface 553d. The third region 553s1 surrounds the light-transmissive plate 140 and is in contact with a lateral surface 140c of the light-transmissive plate 140. The fourth region 553s2 is in contact with the outer surface 552b of the second portion 552.

The outer surface 553c surrounds the upper surface 553a and is in contact with the upper surface 553a and the lower surface 553d. The outer surface 553c is perpendicular to the upper surface 110a of the substrate 110. However, the outer surface 553c may be inclined with respect to the Z axis. The lower surface 553d is in contact with the upper surface 110a of the substrate 110.

Thus, an upper surface 550a of the entire wall 550 includes the upper surface 553a of the third portion 553. An inner surface 550b of the entire wall 550 includes the inner surface 551a of the first portion 551, the first region 552s1 of the second portion 552, and the third region 553s1 of the third portion 553. An outer surface 550c of the entire wall 550 includes the outer surface 553c of the third portion 553. A lower surface 550d of the entire wall 550 includes the lower surface 551c of the first portion 551, the lower surface 552c of the second portion 552, and the outer surface 553c of the third portion 553.

In the present embodiment, the upper surface 550a is parallel to the upper surface 110a of the substrate 110, and a region (the third region 553s1) of the inner surface 550b that includes the upper end 553t is perpendicular to the upper surface 110a of the substrate 110. Thus, the angle θ of a corner portion c between the upper surface 550a and the inner surface 550b is 90 degrees. However, the upper surface 550a may be a curved surface protruding in the direction away from the substrate 110. That is, the angle θ may be greater than 90 degrees and less than 180 degrees.

Next, a method of manufacturing the light-emitting device 500 according to the present embodiment will be described.

Figure 13A:
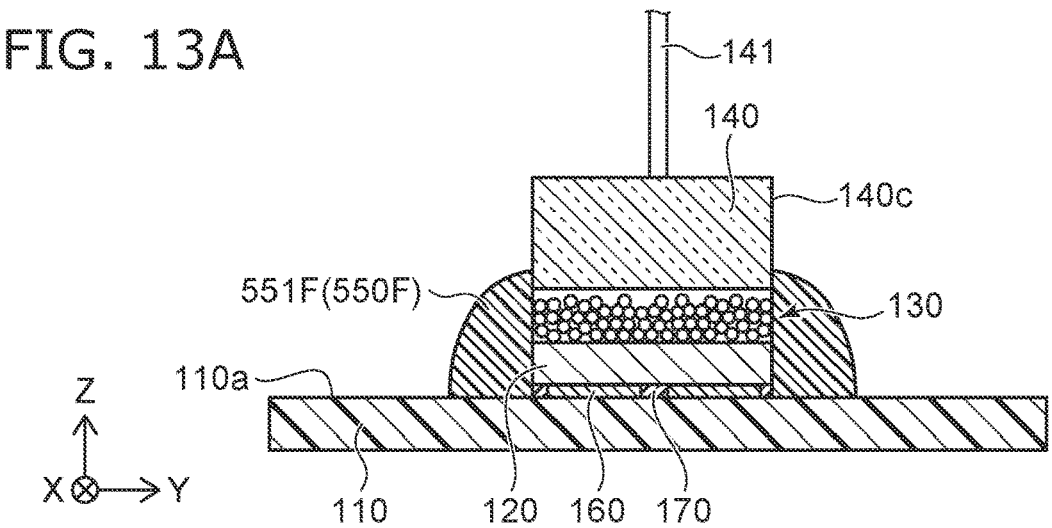
FIG. 13A is a schematic diagram illustrating a method of manufacturing the light-emitting device according to the fifth embodiment.
Figure 13B:
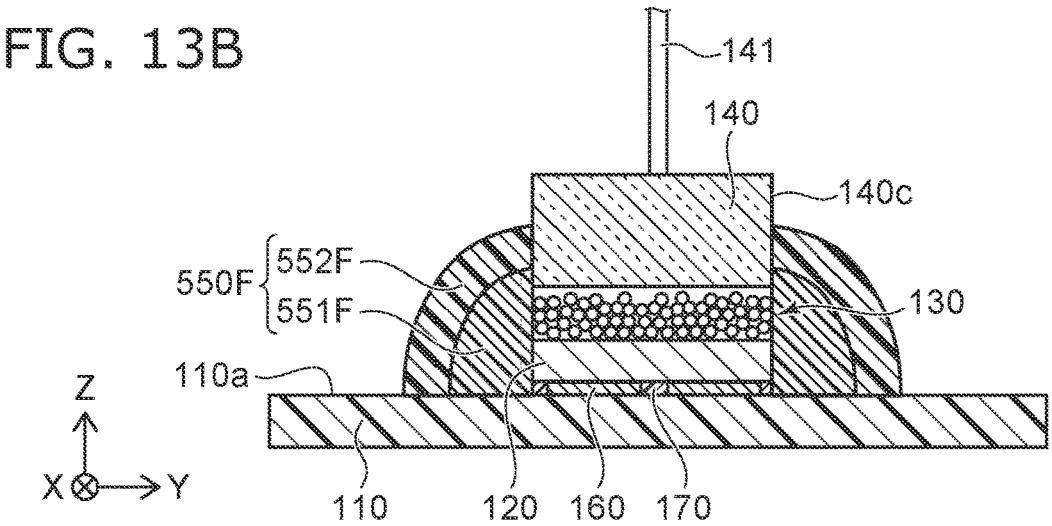
FIG. 13B is a schematic diagram illustrating the method of manufacturing the light-emitting device according to the fifth embodiment.
Figure 13C:
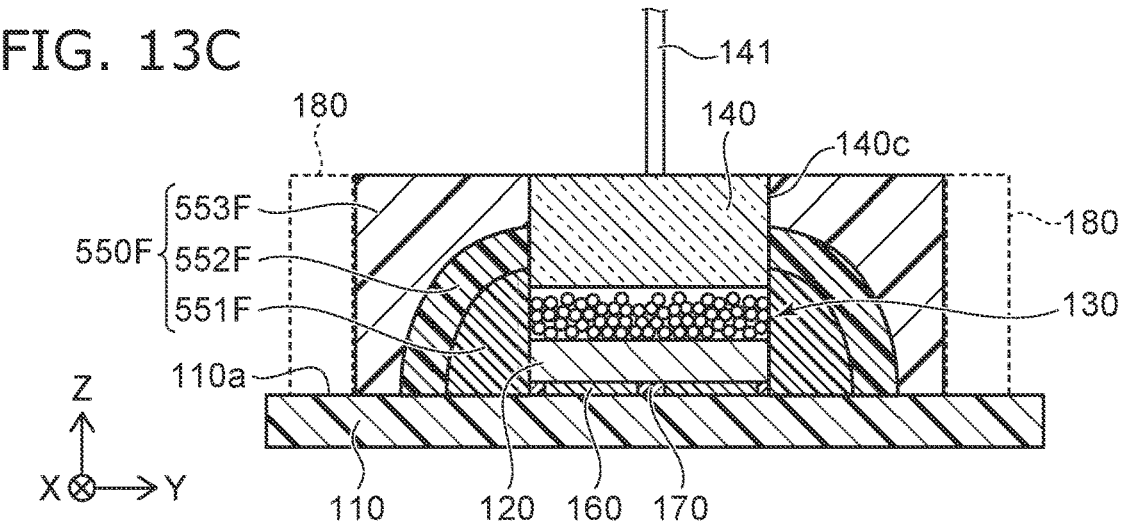
FIG. 13C is a schematic diagram illustrating the method of manufacturing the light-emitting device according to the fifth embodiment.

FIGS. 13A to 13C are schematic diagrams illustrating the method of manufacturing the light-emitting device according to the present embodiment.

The method of manufacturing according to the present embodiment is different from the method of manufacturing the light-emitting device 400 according to the fourth embodiment in terms of a step of providing a light-reflective material 550F.

The light-reflective material 550F includes a first member 551F, a second member 552F, and a third member 553F.

Each of the first member 551F, the second member 552F, and the third member 553F includes a base material formed of an uncured resin material, and a filler formed of a light-reflective material. The first member 551F, the second member 552F, and the third member 553F are different in terms of the concentration of the filler. When the first member 551F is cured, the first member 551F forms the first portion 551 of the wall 550. When the second member 552F is cured, the second member 552F forms the second portion 552 of the wall 550. When the third member 553F is cured, the third member 553F forms the third portion 553 of the wall 550. A method of providing the light-reflective material 550F will be described in detail below.

As in the fourth embodiment, first, as illustrated in FIG. 13A, the first member 551F is provided surrounding the wavelength conversion layer 130 and the lower region of the lateral surface 140c of the light-transmissive plate 140 and in contact with the lower region of the lateral surface 140c of the light-transmissive plate 140.

Subsequently, the first member 551F is semi-cured. Note that the first member 551F need not necessarily be semi-cured.

Subsequently, as illustrated in FIG. 13B, the second member 552F is provided on the first member 551F surrounding the first member 551F. The viscosity of the uncured second member 552F is lower than the viscosity of the uncured first member 551F. Thus, the second member 552F can be sufficiently brought into contact with the lateral surface 140c of the light-transmissive plate 140 while inhibiting the second member 552F from flowing into the wavelength conversion layer 130 with the first member 551F.

Subsequently, the second member 552F is semi-cured. The second member 552F need not necessarily be semi-cured.

Subsequently, as illustrated in FIG. 13C, the third member 553F is provided on the second member 552F surrounding the second member 552F. At this time, the third member 553F is disposed such that the upper surface 550a having been subjected to curing is parallel to the upper surface 110a of the substrate 110. The third member 553F can be disposed such that the upper surface 550a having been subjected to curing protrudes in the direction away from the upper surface 110a of the substrate 110. The viscosity of the uncured third member 553F is lower than the viscosity of the uncured second member 552F. Thus, the third member 553F flows along the shape of the lateral surface 140c of the light-transmissive plate 140.

As described above, before the third member 553F is provided, the first member 551F and the second member 552F contact the lateral surface 140c of the light-transmissive plate 140 and cover the wavelength conversion layer 130. Therefore, the third member 553F can be deformed along the shape of the lateral surface 140c of the light-transmissive plate 140 while the third member 553F is inhibited from flowing into the wavelength conversion layer 130 by both the first member 551F and the second member 552F.

Subsequently, the first member 551F, the second member 552F, and the third member 553F are cured. The subsequent procedure is similar to the fourth embodiment.

Next, an effect of the present embodiment will be described.

In the light-emitting device 500 according to the present embodiment, the wall 550 further includes the third portion 553 provided on the second portion 552 and surrounding the second portion 552. The density of the filler contained in the third portion 553 is lower than the density of the filler contained in the second portion 552. Thus, the reflectance of the second portion 552 located at a position near the wavelength conversion layer 130 can be made higher than the reflectance of the third portion 553. Therefore, propagation of the second light L2 in the wall 550 can be further suppressed.

The viscosity of the uncured second member 552F during manufacturing is higher than the viscosity of the uncured third member 553F. Therefore, the third member 553F can be deformed along the shape of the lateral surface 140c of the light-transmissive plate 140 while the third member 553F is inhibited from flowing into the wavelength conversion layer 130 by both the first member 551F and the second member 552F.

In the embodiment described above, an example is described in which the wall 550 includes the three portions 551, 552, and 553 having different filler densities. However, the wall 550 can include four or more portions having different filler densities.

Sixth Embodiment

Next, a sixth embodiment will be described.

Figure 14:
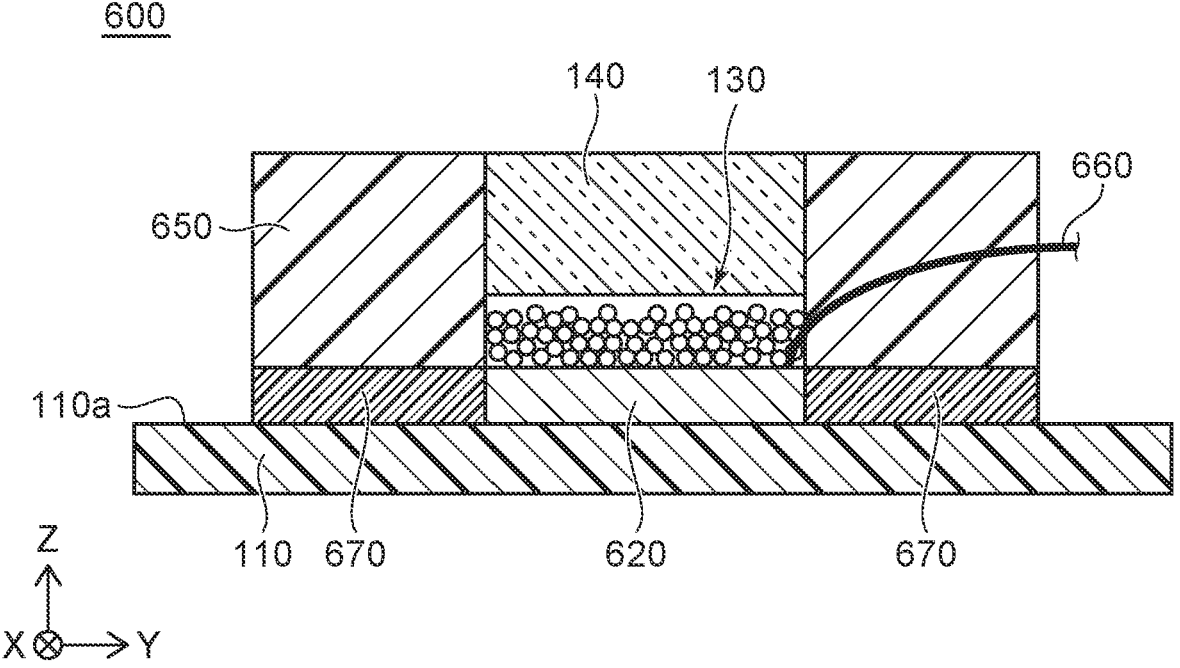
FIG. 14 is a schematic end view illustrating a light-emitting device according to a sixth embodiment.

FIG. 14 is a schematic end view illustrating a light-emitting device according to the present embodiment.

A light-emitting device 600 according to the present embodiment differs from the light-emitting device 100 according to the first embodiment in that a light-emitting element 620 is an LED in which a growth substrate side of the light-emitting element 620 is mounted face up (FU) on the substrate 110.

The light-emitting element 620 is mounted on the substrate 110. An electrode on an upper surface of the light-emitting element 620 is connected to one end of a wire 660. The other end of the wire 660 is connected to an electrode on the substrate 110 (not illustrated). A light-shielding layer 670 is provided surrounding the light-emitting element 620.

The light-shielding layer 670 is in contact with the upper surface 110a of the substrate 110. The light-shielding layer 670 includes a base material formed of a resin material, and a filler dispersed in the base material. A thermosetting resin such as a silicone resin or an epoxy resin can be used as the base material of the light-shielding layer 670. A light-reflective material such as titanium oxide $(TiO_2)$ can be used as the filler of the light-shielding layer 670. A wall 650 is provided on the light-shielding layer 670, and a part of the wire 660 is embedded in the wall 650.

Thus, the light-emitting element 620 can be mounted face up. The wall 650 is only required to surround at least the wavelength conversion layer 130 and need not necessarily surround the light-emitting element 620.

Embodiments of the present disclosure can be utilized in various types of light sources for illumination, in-vehicle light sources, and the like.

REFERENCE SIGNS LIST

100, 200, 300, 400, 500, 600: Light-emitting device; 110: Substrate; 110a: Upper surface; 110b: Lower surface; 120, 620: Light-emitting element; 130: Wavelength conversion layer; 130a: Upper surface; 130k: Air layer; 131: Wavelength conversion particle; 132: Glass layer; 140: Light-transmissive plate; 140a: Upper surface; 140b: Lower surface; 140c: Lateral surface; 141: Holding tool; 150, 250, 350, 450, 550: Wall; 150a, 250a, 450a, 550a: Upper surface; 150b, 250b, 450b, 550b: Inner surface; 150c, 450c, 550c: Outer surface; 150d, 450d, 550d: Lower surface; 150t, 250t: Upper end; 150F, 250F, 450F, 550F: Light-reflective material; 150Fa, 250Fa: Upper surface; 150Fb: Inner surface; 150Fk: Recess; 160: Joint member; 170: Light-shielding layer; 180: Frame member; 180a: Upper surface; 190: Adhesive; 351: Body portion; 351a: Upper surface; 351b: Inner surface; 351c: Outer surface; 351d: Lower surface; 351t: Upper end; 352: Filler portion; 352a: Upper surface; 451, 551: First portion; 451a, 551a: Inner surface; 451b, 551b: Outer surface; 451c, 551c: Lower surface; 451t, 551t: Upper end; 451F, 551F: First member; 451Fb: Inner surface; 452, 552: Second portion; 452a: Upper surface; 452b, 552a: Inner surface; 452c, 552b: Outer surface; 452d, 552c: Lower surface; 452s1, 552s1: First region; 452s2, 552s2: Second region; 452t, 552t: Upper end; 452F, 552F: Second member; 452Fa: Upper surface; 452Fb: Inner surface; 553: Third portion; 553a: Upper surface; 553b: Inner surface; 553c: Outer surface; 553d: Lower surface; 553s1: Third region; 553s2: Fourth region; 553t: Upper end; 553F: Third member; 660: Wire; 670: Light-shielding layer; L: Tangent line; L1: First light; L2: Second light; S1: Region immediately above the light-transmissive plate; S2: Peripheral region; c: Corner portion; t: Thickness; and θ: Angle.

The invention claimed is:

1. A light-emitting device comprising:
   a substrate;
   a light-emitting element provided on the substrate, the light-emitting element being configured to emit a first light;
   a wavelength conversion layer provided on the light-emitting element and containing a plurality of wavelength conversion particles configured to convert a wavelength of a part of the first light and to emit a second light;
   a light-transmissive plate provided above the wavelength conversion layer; and
   a wall including a light-reflective material, the wall surrounding the wavelength conversion layer and the light-transmissive plate and being in contact with a lateral surface of the light-transmissive plate at an inner surface of the wall, wherein
   an upper portion of the wavelength conversion layer includes protrusions and recesses defined by the plurality of wavelength conversion particles,
   the wavelength conversion layer and the light-transmissive plate define an air layer therebetween,
   an upper surface of the wall is flush with an upper surface of the light-transmissive plate,
   the wavelength conversion layer is in direct contact with the light-emitting element, and
   the light-transmissive plate is spaced apart from the wavelength conversion layer.

2. The light-emitting device according to claim 1, wherein
   the wall includes a base material formed of a resin material, and a filler formed of the light-reflective material and dispersed in the base material;
   the wall includes a first portion surrounding the wavelength conversion layer, and a second portion provided on the first portion and surrounding the first portion; and
   a density of the filler contained in the first portion is higher than a density of the filler contained in the second portion.

3. The light-emitting device according to claim 2, wherein
   the wall further includes a third portion provided on the second portion and surrounding the second portion, and

a density of the filler contained in the third portion is lower than the density of the filler contained in the second portion.

4. The light-emitting device according to claim 1, wherein the lateral surface of the light-transmissive plate is perpendicular to an upper surface of the substrate.

5. The light-emitting device according to claim 1, wherein an upper surface of the wall has a shape that protrudes toward a direction away from the substrate.

6. The light-emitting device according to claim 1, wherein an upper surface of the wall is parallel to an upper surface of the substrate.

7. The light-emitting device according to claim 1, wherein
   the wavelength conversion layer further includes a glass layer covering a surface of each of the plurality of wavelength conversion particles,
   the plurality of wavelength conversion particles are bonded to each other via the glass layer with an air layer being defined between the plurality of wavelength conversion particles.

8. The light-emitting device according to claim 1, wherein at least one of an upper surface and a lower surface of the light-transmissive plate has one of a protruding shape, a recessed shape, and a shape with protrusions and recesses.

9. A method of manufacturing a light-emitting device, comprising:
   placing, on a substrate, a light-emitting element configured to emit a first light;
   disposing, in direct contact with the light-emitting element, a wavelength conversion layer containing a plurality of wavelength conversion particles such that an upper portion of the wavelength conversion layer includes protrusions and recesses defined by the plurality of wavelength conversion particles, the wavelength conversion particles being configured to convert a wavelength of a part of the first light and to emit a second light;
   disposing a light-transmissive plate above the wavelength conversion layer with the light-transmissive plate being spaced apart from the wavelength conversion layer so that an air layer is defined between the light-transmissive plate and the wavelength conversion layer;
   providing a light-reflective material that is uncured surrounding the wavelength conversion layer and the light-transmissive plate; and
   curing the light-reflective material to form a wall, an upper surface of the wall being flush with an upper surface of the light-transmissive plate after the curing.

10. The method of manufacturing a light-emitting device according to claim 9, wherein
    the providing of the light-reflective material includes placing an upper end of an inner surface of the light-reflective material at an identical position in a vertical direction as an upper end of a lateral surface of the light-transmissive plate.

11. The method of manufacturing a light-emitting device according to claim 9, wherein
    the providing of the light-reflective material includes providing a first member of the light-reflective material surrounding the wavelength conversion layer, and providing a second member of the light-reflective material on the first member and surrounding the first member, a viscosity of the first member being higher than a viscosity of the second member.

12. The method of manufacturing a light-emitting device according to claim 11, wherein the providing of the light-reflective material further includes providing a third member of the light-reflective material on the second member and surrounding the second member, a viscosity of the third member being lower than the viscosity of the second member.

13. The method of manufacturing a light-emitting device according to claim 9, wherein the disposing of the wavelength conversion layer includes spraying, onto the light-emitting element, a slurry material including the plurality of wavelength conversion particles.

14. The method of manufacturing a light-emitting device according to claim 13, wherein the slurry material further includes polysilazane, and the disposing of the wavelength conversion layer further includes converting the polysilazane into silica by heating the slurry material or leaving the slurry material at room temperature for a prescribed time, to cover each of the plurality of wavelength conversion particles with a glass layer containing the silica with an air layer being defined between the plurality of wavelength conversion particles.

15. The method of manufacturing a light-emitting device according to claim 9, further comprising performing surface processing on at least one of an upper surface and a lower surface of the light-transmissive plate.

\* \* \* \* \*